(12) United States Patent
Mochizuki

(10) Patent No.: US 8,898,602 B2
(45) Date of Patent: Nov. 25, 2014

(54) APPARATUS FOR DESIGN ASSIST AND METHOD FOR SELECTING SIGNAL LINE ONTO WHICH TEST POINT FOR TEST CONTROLLING IS TO BE INSERTED IN CIRCUIT TO BE DESIGNED

(71) Applicant: Fujitsu Limited, Kawasaki (JP)

(72) Inventor: Tsuyoshi Mochizuki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 14/034,616

(22) Filed: Sep. 24, 2013

(65) Prior Publication Data

US 2014/0101627 A1    Apr. 10, 2014

(30) Foreign Application Priority Data

Oct. 5, 2012    (JP) .................................. 2012-223203

(51) Int. Cl.
*G06F 17/50*    (2006.01)

(52) U.S. Cl.
CPC .......... *G06F 17/5045* (2013.01); *G06F 17/505* (2013.01); *G06F 2217/14* (2013.01)
USPC ....................................................... 716/106

(58) Field of Classification Search
CPC .............. G06F 17/5022; G06F 17/504; G06F 17/5036; G06F 17/5081; G06F 17/5045; G06F 17/505; G06F 2217/14
USPC ....................................................... 716/106
See application file for complete search history.

(56) References Cited

U.S. PATENT DOCUMENTS 6,038,691 A *   3/2000   Nakao et al. .................. 714/733
6,256,759 B1    7/2001   Bhawmik et al.

2007/0136700 A1*   6/2007   Wang et al. ...................... 716/4

FOREIGN PATENT DOCUMENTS

JP    5-172904    7/1993

OTHER PUBLICATIONS

M. Yoshimura, et al., "A Test Point Insertion Method to Reduce the Number of Test Patterns", Proceedings of the 11th Asian Test Symposium (ATS'02), 2002 IEEE.
Geuzebroek, M. J., et al.,"Test Point Insertion that facilitates ATPG in reducing test time and data volume," Proceedings International Test Conference 2002, ITC 2002, Baltimore, MD, Oct. 7-10, 2002, IEEE, pp. 138-147, Paper 6.1, XP010609735.
Geuzebroek, M. J. et al.,"Test Point Insertion for Compact Test Sets," Proceedings International Test Conference 2002, ITC 2000, Baltimore, MD, Oct. 30-Nov. 1, 2000, IEEE, pp. 292-301, Paper 10.4, XP001049626.
Extended European Search Report dated Feb. 10, 2014 for corresponding EP Application No. 13186375.5.

* cited by examiner

*Primary Examiner* — Vuthe Siek
(74) *Attorney, Agent, or Firm* — Fujitsu Patent Center

(57) ABSTRACT

Multiple signal lines in a circuit net the vertex of which is a maximum observation point having a maximum diagnosis difficulty index among a plurality of diagnosis difficulty indexes of all the observation points that are used for observing signal lines in the circuit, each of the plurality of diagnosis difficulty indexes of the observation points representing the difficulty in fault diagnosis at the corresponding observation point are selected as first insersion candidates. A second insertion candidate onto which the test point is to be inserted is selected from the first insertion candidates, considering effects of inserting the test point onto the respective first insertion candidates. Thereby, insertion of a test point reduces dispersion of the diagnosis difficulty indexes of all the observation points.

18 Claims, 15 Drawing Sheets

BEFORE TPI

FIRST METHOD ($\sigma=22.9$)

METHOD OF FIRST EMBODIMENT
($\sigma=11.8$)

BEFORE TPI (σ=15)

SECOND METHOD (σ=12.5)

METHOD OF FIRST EMBODIMENT
(σ=2.4)

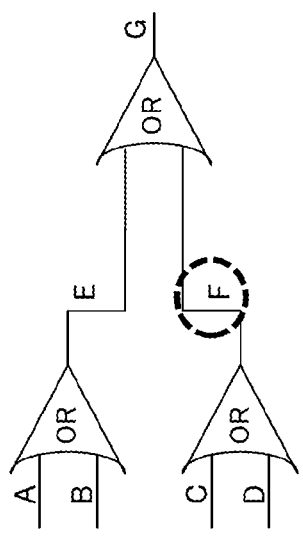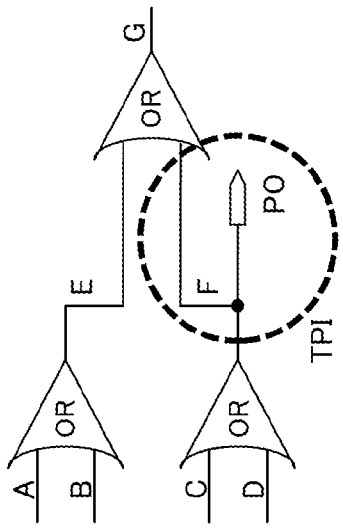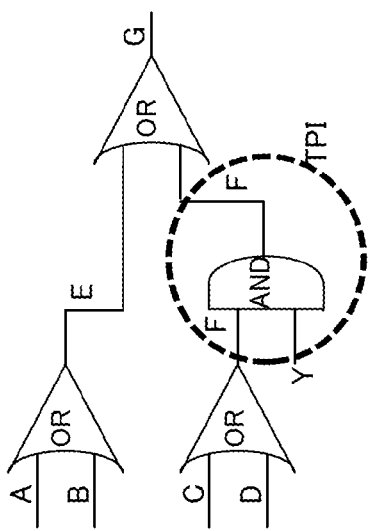

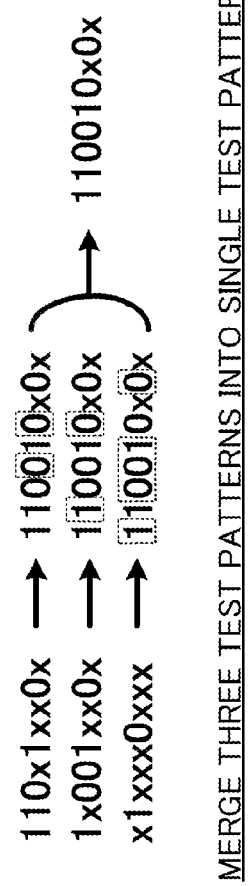
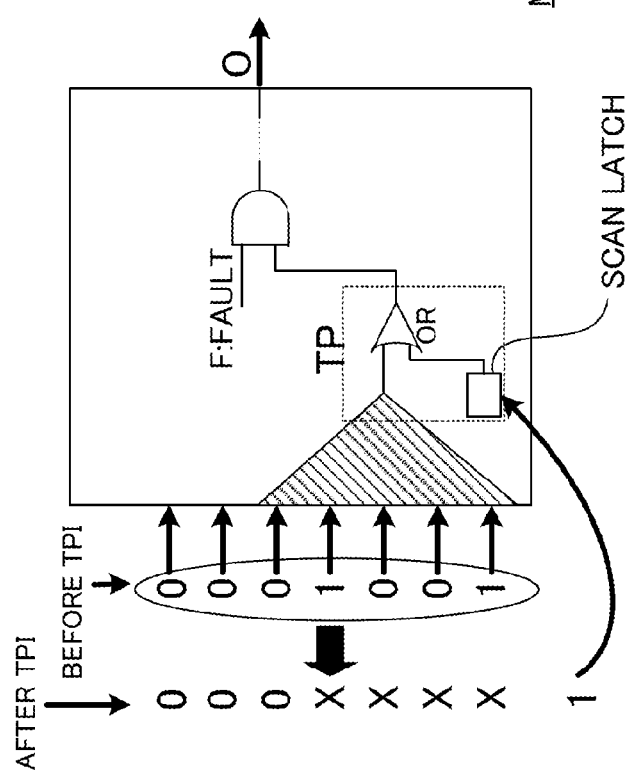
FIG. 11A
FIG. 11B

FIRST METHOD

BEFORE TPI

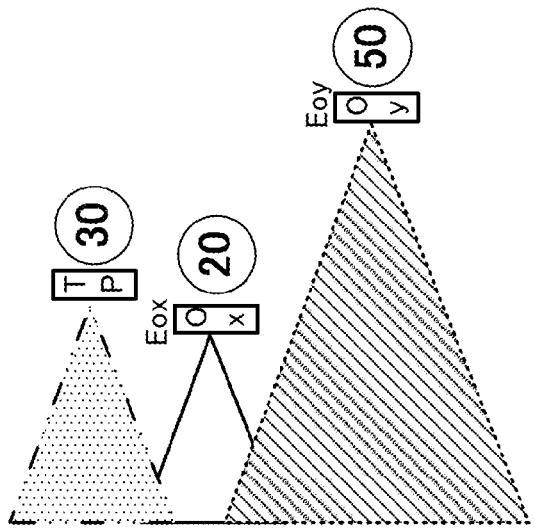
FIG. 14B SECOND METHOD
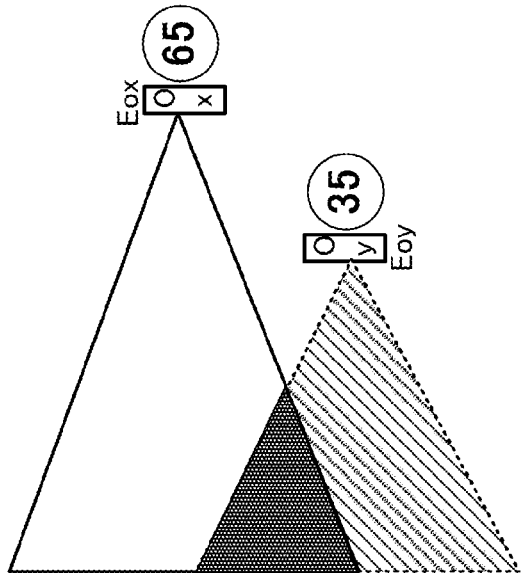
FIG. 14A BEFORE TPI

APPARATUS FOR DESIGN ASSIST AND METHOD FOR SELECTING SIGNAL LINE ONTO WHICH TEST POINT FOR TEST CONTROLLING IS TO BE INSERTED IN CIRCUIT TO BE DESIGNED

CROSS-REFERENCE TO RELATED APPLICATION

This application is based upon and claims the benefit of priority of the prior Japanese Application No. 2012-223203 filed on Oct. 5, 2012 in Japan, the entire contents of which are hereby incorporated by reference.

FIELD

The embodiment discussed herein is directed to a design assist apparatus, a method for assisting design, and a computer-readable recording medium having stored herein a program for assisting design.

BACKGROUND

Recent expanding of the scale of Large Scale Integrations (LSIs) and development of multi-core processors have increased the number of gates and internal signal lines and have consequently increased the number of faults needs to be detected. For the above, the time for testing using an LSI tester and the number of test patterns to be stored in the LSI tester increase to raise the cost for testing. Since the cost for testing increases in proportional to the number of test patterns, various techniques of reducing the number of test patterns have been proposed.

An example of such a technique of reducing the number of test patterns reduces the number of Automatic Test Pattern Generator (ATPG) patterns by inserting test points to an LSI having a full-scan system (see following Non-Patent Literature 1).

Here, a test point is a logic circuit for test controlling that is to be placed into a circuit to be tested, aiming at improving controllability and observability of a signal line in the circuit.

[Non-Patent Literature 1] M. Yoshimura, et al. "A Test Point Insertion Method to Reduce the Number of Test Patterns", Proceedings of the 11th Asian Test Symposium (ATS'02) 2002 IEEE, pp 298-304

Here, the term "controllability" is an index set for each signal line or each terminal (pin) included in a circuit to be tested, and corresponds to the minimum number of signal lines for which logical values are to be set in order to set the values of the signal line and the pin to 0 or 1. The term "observability" is an index set for each signal line or each terminal (pin) included in a circuit to be tested, and corresponds to the minimum number of signal lines for which logical values are to be set in order to propagate a signal to an observation point. The term "observation point" is a point in a circuit to be tested at which the value of the point can be observed, and specifically corresponds to an output pin or a scan FF (Flip-Flop). The term "diagnosis difficulty index" is an index representing the difficulty in fault diagnosis at an observation point included in a circuit to be tested, and is used to find a signal line or a terminal that would be a bottleneck in reducing the number of test patterns.

A test point is a logical circuit that functions as a control point such as an AND gate or an observation point such as an output pin. The term "control point" is a point in a circuit to be tested at which the value of the point can be set, and is exemplified by a combination circuit including, for example, an AND gate and an OR gate that sets the value of a signal line to 0 or 1, and an input pin and a scan FF. Hereinafter, the term "test point" is sometimes abbreviated to "TP". Inserting a TP into an internal signal line in a circuit to be tested for the improvement in testability, that is, in facilitating of generation of a test pattern, is sometimes referred to as Test Point Insertion, which may be abbreviated to "TPI".

The above technique focuses on the fact that the presence of an observation point on which faults are concentrated increases the number of test patterns. The above technique determines a signal line which has the smallest maximum value of the diagnosis difficulty index among the diagnosis difficulty indexes at all the observation points in a circuit to be tested to a point onto which a TP is inserted, the signal line being one among the signal lines included in a circuit net (i.e., a logic cone) the vertex of which has the maximum value of the diagnosis difficulty index among all the observation points in the circuit. At that time, diagnosis difficulty indexes (e.g., a ratio of faults observed at each observation point) are defined and calculated using the scales of the 0/1 controllability and the observability, and a point onto which a TP is to be inserted is determined on the basis of the calculated diagnosis difficulty indexes. The above circuit net corresponds to a circuit net inside a logic cone obtained by back-tracing the signal lines from the vertex (i.e., the observation point having the maximum diagnosis difficulty index) to an input point or a control point.

However, the above technique evaluates signal lines having a possibility of being inserted a TP thereto and determines a signal line onto which a TP is to be inserted on the basis of the maximum diagnosis difficulty index among those of all the observation point of a circuit to be tested. For the above, if there are multiple logic cones the vertices of which have the maximum or the substantially maximum diagnosis difficulty index, it is impossible to select an optimum signal line in a desired logic cone to be a TPI point where TP is to be inserted in order to reduce the number of test patterns. In addition, there is a possibility of, if a TP is inserted into a logic cone, adversely affecting the diagnosis difficulty indexes of observation points in the remaining logic cones, which consequently would not successfully reduce the number of test patterns. In other words, if the diagnosis difficulty indexes of all the observation points after a TP is inserted (TPI) have large dispersion, the number of test patterns is not efficiently reduced.

SUMMARY

There is provided a design assist apparatus including a processor that selects, as an insertion candidate, a signal line onto which a test point for test controlling is to be inserted and which is included in a circuit to be designed, wherein the processor: selects first insertion candidates being a plurality of signal lines in a circuit net the vertex of which is a maximum observation point having a maximum diagnosis difficulty index among a plurality of diagnosis difficulty indexes of all the observation points that are used for observing signal lines in the circuit, each of the plurality of diagnosis difficulty indexes of the observation points representing the difficulty in fault diagnosis at the corresponding observation point; and selects a second insertion candidate onto which the test point is to be inserted from the first insertion candidates, considering effects of inserting the test point onto the respective first insertion candidates.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF THE DRAWINGS

FIGS. 9A to 9C are diagrams describing test point insertion;

FIGS. 11A and 11B are diagrams illustrating the principle of test pattern compression by test point insertion;

FIGS. 14A and 14B are diagrams illustrating diagnosis difficulty indexes obtained in another method (second method) of test point insertion.

DESCRIPTION OF THE PREFERRED EMBODIMENTS

Hereinafter, the first embodiment will now be described with reference to the accompanying drawings.

(1) Design for Testabilit and Test Point Insertion:

Description will now be made in relation to design for testability and test point insertion (TPI) adopting the technique of the present invention with reference to FIGS. 7 to 15.

Figure 7:
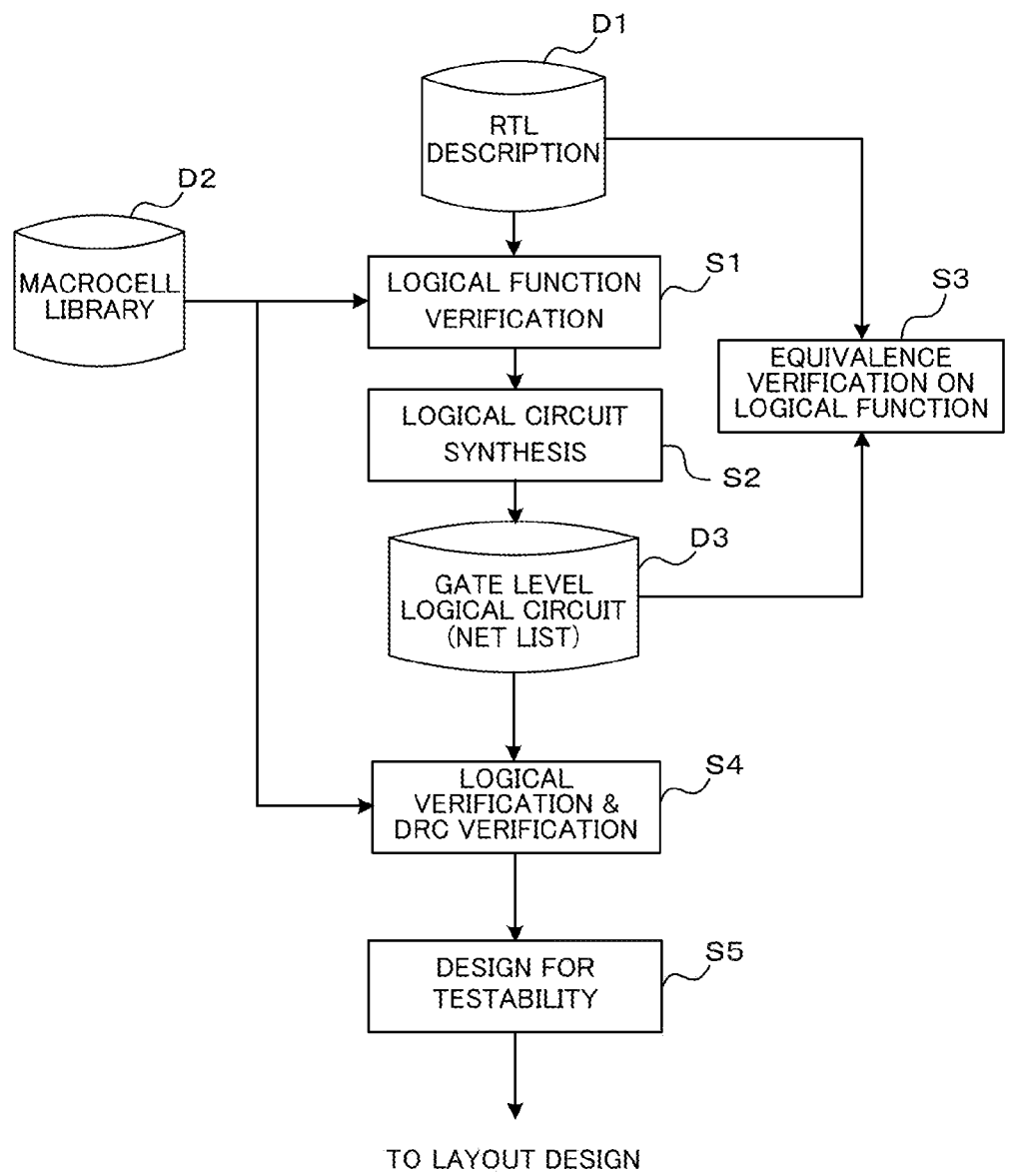
FIG. 7 is a flow diagram denoting a succession of procedural steps of logical design.

A succession of procedural steps of logical design of a circuit (e.g., an LSI) to be designed will now be described with reference to the flow diagram of FIG. 7.

In logical design, the logical simulator verifies logical function of a circuit to be designed on the basis of the Register Transfer Level (RTL) description D1 of the circuit and a macrocell library D2 (step S1). Then a logical synthesis tool synthesizes the logical circuits of the circuit to be designed (step S2) and thereby obtains a gate-level logical circuit of the circuit, which corresponds to a net list (logical database (DB)) D3.

On the basis of the obtained net list D3 and the RTL description D1, a formal verifier, which is a Computer Aided Design (CAD) tool that carries out equivalence checking of logical function of the circuit, carries out equivalence checking of the logical function of the circuit to be designed (step S3). Furthermore, on the basis of the obtained net list D3 and the macrocell library D2, the logic simulator carries out logic verification on the circuit to be designed and the CAD which checks design rule on the circuit carries out Design Rule Check (DRC) verification (step S4).

After that, Design For Testability (DFT) is carried out on the circuit being designed (step S5). DFT designs the circuit (for example, inserting a testing circuit) in the logical designing, considering a test to be carried out later, so that a fault inside the circuit can be easily detected through an external terminal. Then, ATPG generates a test pattern based on the result of DFT, which is followed by layout designing of the circuit to be designed.

Next, the procedure of design for testability adopting the technique of the present invention will now be described with reference to the flow diagram of FIG. 8.

The design for testability facilitates generation of a test pattern on the basis of the net list (logical DB) D3 obtained in the above manner (step S6) and thereby a test point insertion list D4 is obtained. After that, a test point is inserted on the basis of the test point insertion list D4 (step S7), a logical DB (net list) D5 after the TPI is obtained, and a test pattern based on the net list D5 after the TPI is generated (step S8).

Figure 8:
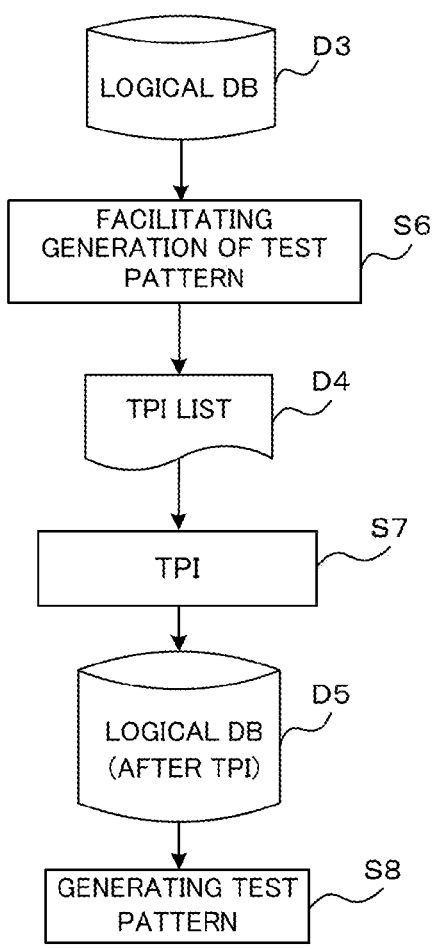
FIG. 8 is a flow diagram denoting a succession of procedural steps of design for testability.

In the facilitating of generation of a test pattern in step S6 of FIG. 8, it is known that a test point is inserted onto a signal line having a difficulty in generating a test pattern in order to reduce the number of test patterns as described the above.

Here, description will now be made in relation to test point insertion with reference to FIGS. 9A to 11B.

FIG. 9A illustrates a circuit consisting of three logical sum gate (OR gate) and seven signal lines represented by symbols A to G. Here, description assumes that the signal line F is a bottleneck in generating a test pattern and therefore improvement in the testability of the signal line F is desired.

As illustrated in FIG. 9B, in order to improve the 0-controllability of the signal line F, a logical product gate (AND gate) is added onto the signal line F and serves as a TP in the form of a control point. A signal from one of the logical sum gate and a control signal from a non-illustrated scan FF (Flip-Flop) are input into the added logical product gate, so that the 0-controllability of the signal line F is enhanced.

As illustrated in FIG. 9C, in order to improve the observability of the signal line F, an external output pin PO is added onto the signal line F and serves as a TP in the form of observation point, so that the observability of the signal line F can be enhanced.

Figure 10B:
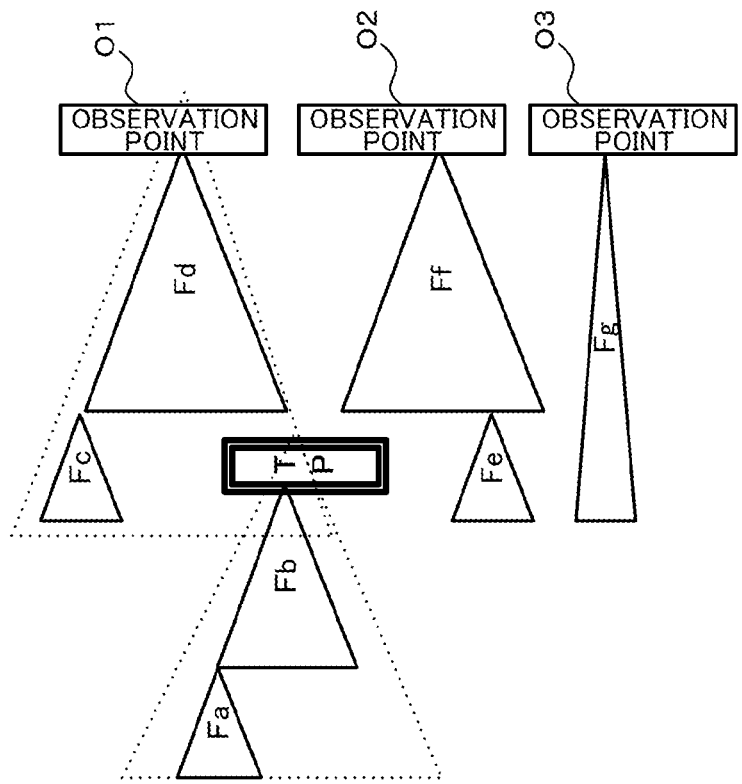
FIGS. 10A and 10B are diagrams describing test point insertion.
Figure 10A:
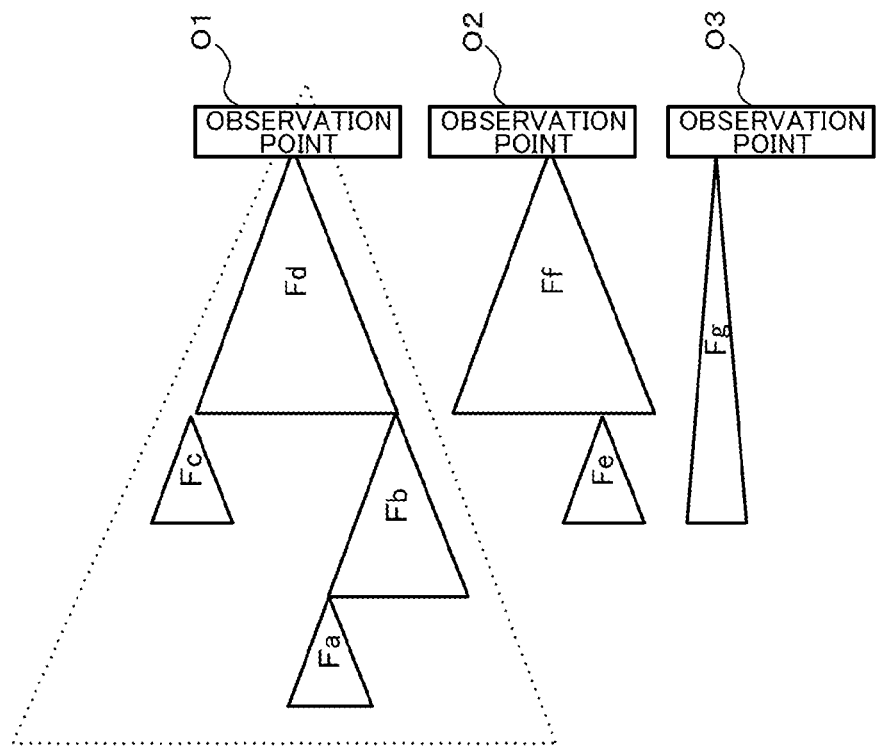

Next, description will now be made in relation to a case where, in a circuit consisting of three observation points O1 to O3 and logic cones Fa-Fg as illustrated in FIG. 10A, faults are concentrated on a signal line (e.g., signal line F of FIG. 9A) that connects logic cones Fb and Fd to each other. In this case, as illustrated in FIG. 10B, TPI that inserts a TP into a signal line connecting logic cones Fb and Fd with each other is carried out. This divides the logic cones Fa to Fd the vertex of which is the observation point O1 into logic cones Fd and Fc the vertex of which is the observation point O1 and logic cones Fb and Fa the vertex of which is the observation point TP currently inserted. As described above, the test point insertion (TPI) is a technique to reduce the number of test patterns and consequently reduce the cost for test by retrieving a signal line on which faults are concentrated and which is to be observed and inserting a TP onto the retrieved signal line.

An example (first method) of the procedure of TPI that is to be detailed below with reference to FIG. 12 focuses on the fact that the presence of an observation point on which faults are concentrated increases the number of test patterns. In the first method, a Computer Aided Design (CAD) tool defines and calculates diagnosis difficulty indexes (e.g., ratios of faults observed in the respective observation points) using the scales of the 0/1 controllability and the observability on the basis of the logical DB (net list) D3, inserts a TP based on the calculated diagnosis difficulty indexes, and outputs a test point insertion list D4.

Then, in the first method, as to be detailed below with reference to FIG. 12, a signal line onto which a TP is to be inserted is included in a logic cone the vertex of which is an observation point having the maximum diagnosis difficulty index among all the observation points of a circuit to be designed, and makes, when a TP is inserted onto the signal line, the maximum diagnosis difficulty index among the diagnosis difficulty indexes of all the observation points the smallest. Thereby, since faults that have concentrated on a particular observation point are dispersed, the number of test patterns is reduced, and the costs for testing are consequently reduced.

Here, it seems that: since many faults are detected at an observation point having a high diagnosis difficulty index, many values are allocated to control points having input ends that the observation point having a high diagnosis difficulty index can reach. In this case, allocation of "0" or "1" seems to be concentrated on a particular observation point to decline the compression efficiency of ATPG patterns, and thereby the number of ATPG patterns increases. As a solution to the above, the diagnosis difficulty index of the observation point O is declined through TPI as illustrated in FIG. 11A and thereby the compression efficiency of ATPG patterns is enhanced to reduce the number of ATPG patterns as depicted in FIG. 11B. This means that, as illustrated in FIG. 11A, the number of "don't care" values (i.e., indeterminate number X) increases by inserting a control point (TP) onto a signal line that can be reached from the observation point O and thereby enhancing the controllability. As depicted in FIG. 11B, increasing the number of "don't care" values in test patterns makes it possible to merge, for example, three test patterns into a single test pattern, so that the compression efficiency of the test patterns are enhanced to reduce the number of test patterns. The inserted TP depicted in FIG. 11A is a control point consisting of, for example, an OR gate and a scan latch.

Next, description will now be made in relation to a procedure of TPI carried out by a CAD tool (processor, not illustrated) with reference to the flow diagram of FIG. 12 (steps S201 to S222).

To begin with, the CAD tool determines whether the number of TPs already inserted reaches an appointed TP number that is determined in advance (step S201). If the number of inserted TPs does not reach the appointed TP number (No route of step S201), the CAD tool performs logic data analysis based on the net list D3 (see FIGS. 7 and 8) and generates an internal table including, for example, a control table, an external input pin table, an external output pin table, a net table, a gate table, an input/output pin table (step S202).

Using data in the generated internal table and a method of Sandia Controllability Observability Analysis Program (SCOAP), the CAD tool calculates the values of CC0, CC1, and CO respectively representing the 0-controllabilty, the 1-controllability, and the observability of each of all the signal lines P1, ..., and Pn in the circuit to be designed and stores the calculated values to a diagnosis data table (step S203). Then, faults F1, ..., and Fn are set one for each of the signal lines P1, ..., and Pn in the circuit to be designed (step S204). The faults set for the respective signal lines propagate to observation points O1, ..., and Om using the 0/1 controllability and the observability calculated in step S203 (step S205).

Here, the "SCOAP method" measures and analyzes the number of signal lines that need allocation of logical values thereto to control and observe the logical values of the respective signal lines in analysis of testability from the viewpoint of the structure of the circuit to be designed. The term "0/1 controllabilty" is the smallest value of the number of signal lines in which logical values need to be set when the values of the signal lines are "0" (or "1"). The term "observability" is the smallest value of the number of signal lines for which logical values need to be set to propagate the values of the respective signal lines to an external output.

Then the CAD tool counts the number of faults propagated to each observation point and calculates the ratio (E1, ..., and Em) of faults at each observation point, which is regarded as the diagnosis difficulty index of the observation point, by dividing the total number of faults observed at all the observation point by the number of faults observed at the observation point (step S206). The CAD tool extracts maximum value Emax from the diagnosis difficulty indexes E1, ..., and Em of all the observation point of the circuit to be designed (step S207), and sets the signal line Px having the extracted maximum value Emax to be a provisional insertion candidate onto which a TP is to be inserted (step S208).

Subsequently, an optimum TP is obtained in the following manner.

First of all, a logic cone the vertex of which is the observation point Ox having the maximum diagnosis difficulty index Emax is obtained by backtracing the signal lines from the observation point Ox to a control point or input point Ix. Multiple signal lines in the obtained logic cone are extracted to be TP insertion candidates, which are regarded as a set Q of TP insertion candidates (step S209).

Then determination is made as to whether all the TP insertion candidates underwent processing (step S210). If an element (i.e., a signal line of a TP insertion candidate) not undergoing the processing remains (NO route in step S210), the CAD tool extracts element Py not undergoing processing from the set Q and provisionally inserts a TP into the signal line Py extracted (step S211). The processing of the above steps S202 to S207 are performed on the circuit in which a TP is provisionally inserted onto the signal line Py (steps S212 to S217).

Specifically, the CAD tool carries out logical data analysis using net list of the circuit in which a TP is provisionally inserted into the signal line Py and generates a control table, an external input pin table, an external output pin table, a net table, a gate table, an input/output pin table (step S212). Using data in the above various tables generated and the SCOAP method, the CAD tool calculates the values of CC0, CC1, and CO respectively representing the 0-controllabilty, the 1-controllability, and the observability of each of all the signal lines P1, ..., and Pn+1 in the circuit to be designed and stores the calculated values to a diagnosis data table (step S213). Then, faults F1, ..., and Fn+1 are set one for each of the signal lines P1, ..., and Pn+1 in the circuit to be designed (step S214). The faults set for the respective signal lines propagate to observation points O1, ..., and Om+1 using the 0/1 controllability and the observability calculated in step S213 (step S215). Then the CAD tool counts the number of faults propagated to each observation point and calculates the ratio (E1, ..., and E'm+1) of faults at each observation point, which is regarded as the diagnosis difficulty index of the observation point, by dividing the total number of faults observed at all the observation point by the number of faults observed at the observation point (step S216). The CAD tool selects maximum value E'max from the diagnosis difficulty indexes E1, . . . , and E'm+1 of all the observation point of the circuit to be designed (step S217).

After that, E'max selected in step S217 and the Emax (i.e., the minimum Emax) obtained before the selection of the current E'max are compared to determine whether the current E'max is smaller than Emax (step S218). If the E'max is smaller than Emax (YES route in step S218), it seems that faults that have concentrated on a particular observation point are dispersed. Consequently, the signal line Py is selected to be a point on which a TP is to be inserted and Emax is substituted with the E'max currently selected (step S219). The TP provisionally inserted onto the signal line Py is deleted (step S220). In contrast, if the E'max is not smaller than Emax (NO route in step S218), the CAD tool skips step S219 and deletes the TP provisionally inserted onto the signal line Py (step S220). The initial value of Emax is one extracted in step S207.

The CAD tool repeats the processing of steps S210 to S220 until all the TP insertion candidates (signal lines) underwent processing in step S210. If the CAD tool determines all the TP insertion candidates (signal lines) underwent processing (YES route in step S210), a signal line Py finally selected as a TPI point onto which a TP is to be inserted is added to the TPI list D4 (step S221) and the procedure returns to step S201.

The above procedure evaluates the diagnosis difficulty indexes of all the elements in the set Q, that is, the diagnosis difficulty indexes of all the signal lines in a logic cone the vertex of which is the observation point Ox having the maximum diagnosis difficulty index among all the observation points in the circuit to be designed. Consequently, among multiple signal lines (set Q) in the logic cone, the signal line Py that minimizes, when a TP is inserted onto the signal line Py, the maximum value Emax of the diagnosis difficulty indexes of all the observation point of the circuit to be designed, in other words, the signal line that contributes the most to reduce the number of test patterns to be generated, is determined to the TPI point onto which a TP is to be inserted. Accordingly, faults that have been concentrated on a particular observation point are dispersed to reduce the number of test patterns and further reduce the costs for testing.

The procedure of steps S201 to S221 is repeated until the number of TPs already inserted is determined to reach the appointed TP number in step S201. If the number of TPs already inserted does not reach the appointed TP number (NO route in step S201), the above procedure (steps S202 to S221) is carried out on the basis of the net list that considers the TPs already inserted at that time point. In contrast, when the number of TPs already inserted reaches the appointed TP number (YES route in step S220), the TPI list D4 is stored in, for example, a memory (step S222) and the TPI processing, facilitating generation of a test pattern (see step S6 in FIG. 8) is completed.

Figure 13B:
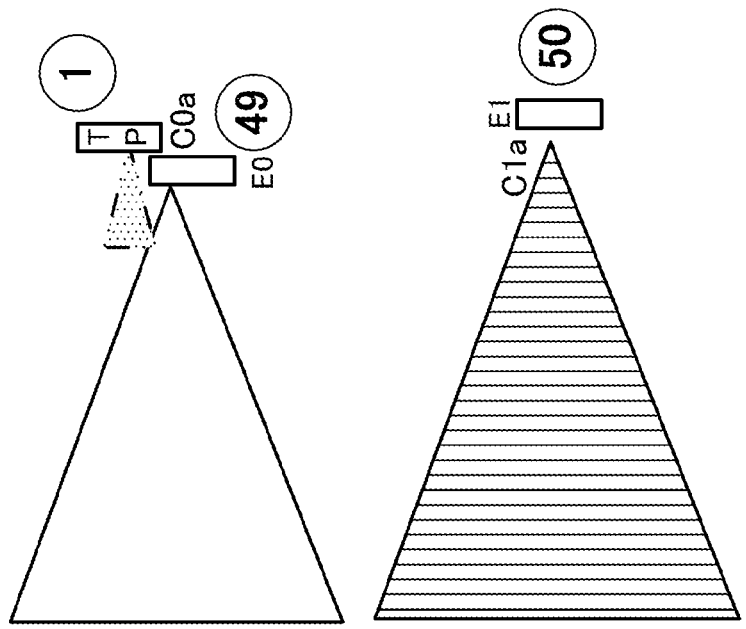
FIGS. 13A and 13B are diagrams illustrating diagnosis difficulty indexes obtained in a first method of FIG. 12.
Figure 13A:
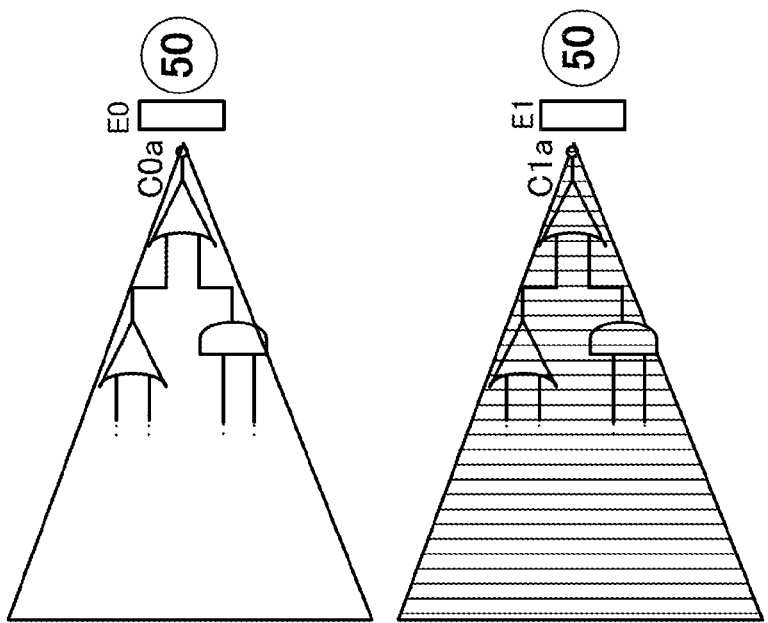

The above first method evaluates a signal line being a candidate for TPI on the basis of the maximum value among the diagnosis difficulty indexes of all the observation points in the circuit to be designed to determine a TPI point onto which a TP is to be inserted. For the above, if there are multiple logic cones the vertexes of which have the maximum or the substantially maximum diagnosis difficulty indexes among all the observation point as illustrated in FIG. 13A, it is impossible to select an optimum signal line as a TPI point onto which a TP is to be inserted for reducing the number of test patterns in a desired logic cone as illustrated in FIG. 13B. Consequently, the number of test patters is not reduced.

Figure 12:
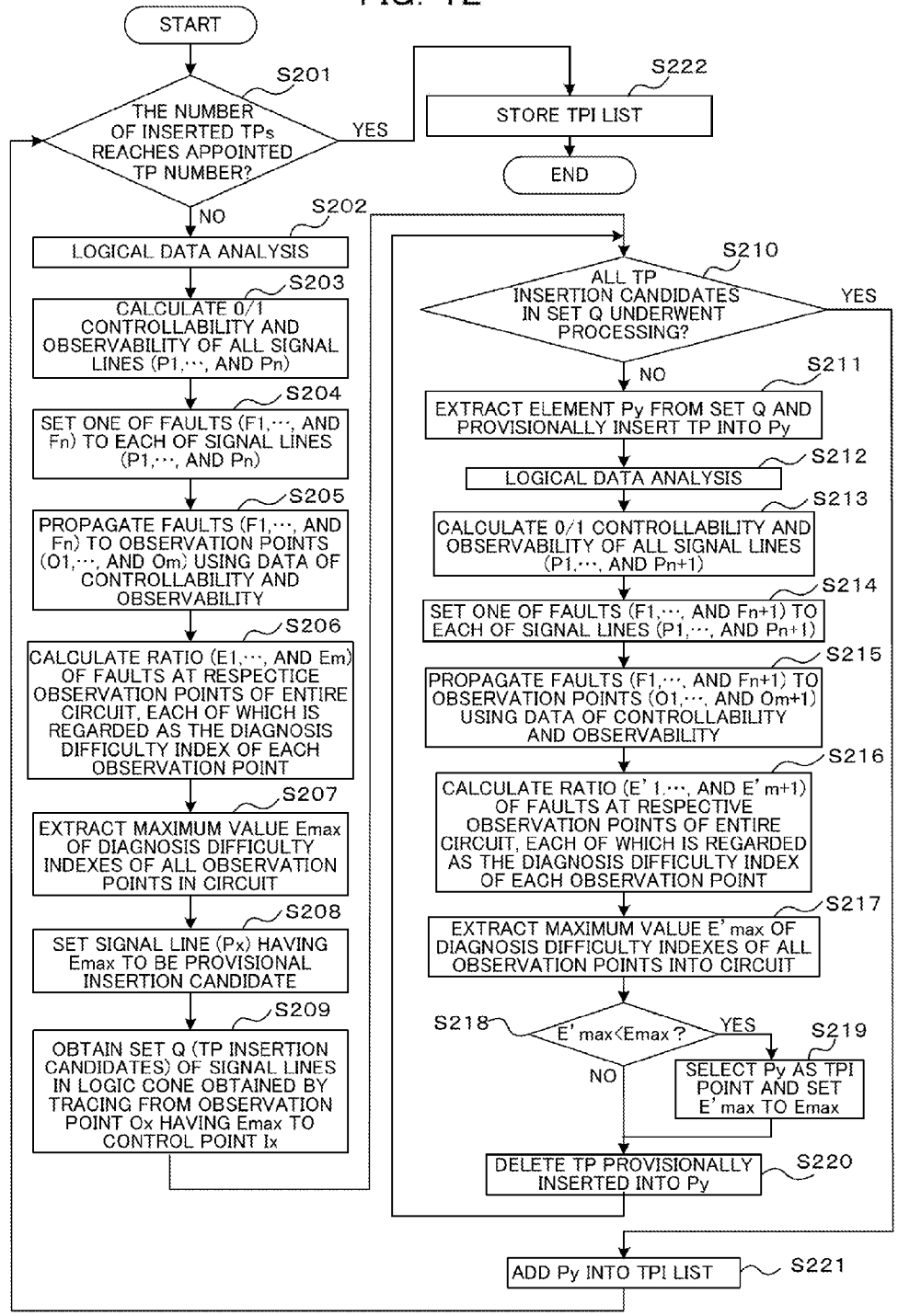
FIG. 12 is a flow diagram illustrating an example (first method) of a succession of procedural steps of test point insertion.

FIGS. 13A and 13B are diagrams illustrating diagnosis difficulty indexes obtained in the first method (an example of procedure of test point insertion) described the above with reference to FIG. 12. In the example of FIG. 13A representing a status before the TPI, a logic cone C0a the vertex of which is an observation point having a diagnosis difficulty index E0 of 50 and a logic cone C1a the vertex of which is an observation point having a diagnosis difficulty indexes E1 of 50 are present. Here, a signal line in the logic cone C0a is assumed to be a TP insertion candidate and is evaluated (see steps S210 to S220 in FIG. 12). In this case, although a single TP inserted into the logic cone C0a and the diagnosis difficulty index E0 of the observation point of the logic cone C0a comes to be 49, the diagnosis difficulty index E1 of the other logic cone C1a is always 50 and therefore maxima Emax and E'max both remain at 50. Consequently, the determination at step S218 of FIG. 12 always resulted in NO route, which makes it impossible to select an optimum signal line as a TPI point onto which a TP is to be inserted for reducing the number of test patterns.

To solve the above problem, there is proposed a second method that evaluates a signal line being regarded as a TP insertion candidate considering the diagnosis difficulty indexes of a single logic cone regarded as a target, not considering the maximum diagnosis difficulty index among those of all the observation point of the entire circuit to be designed. This second method, which considers only a target logic cone, makes the diagnosis difficulty index at the observation point (vertex) small to make it possible to select the optimum TPI point. However, TPI in the second method may vary the 0/1 controllability and the observability and has a possibility of detecting a fault, which has been detected in the target logic cone, in another logic cone. This worsens the diagnosis difficulty index of a logic cone except for the target logic cone and the diagnosis difficulty index of the entire circuit is not improved, which makes it impossible to reduce the number of test patterns despite the TPI.

Figure 15:
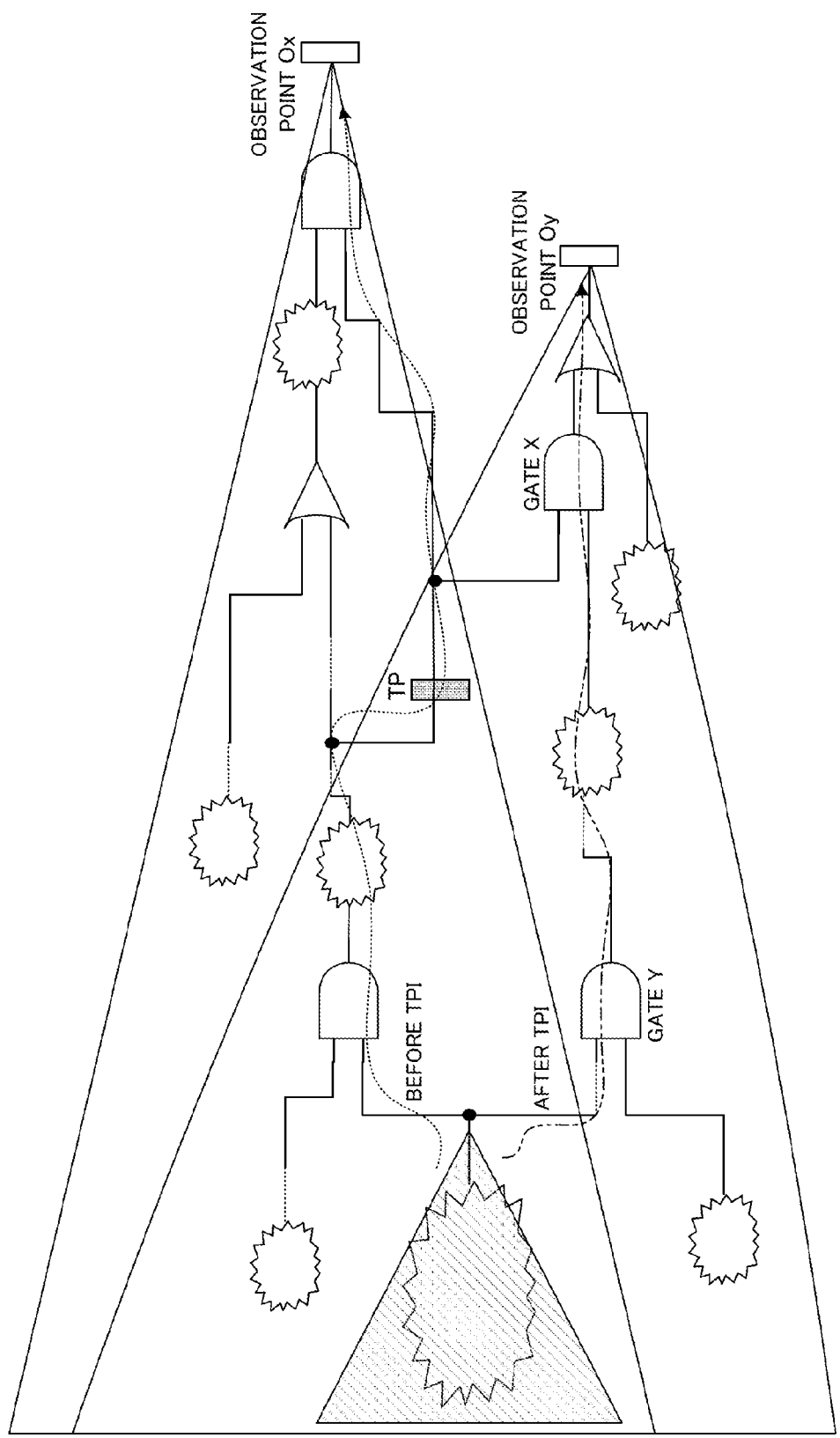
FIG. 15 is a diagram explaining a reason for degrading a diagnosis difficulty index when the second method of FIG. 14B is applied.

The problem of the above second method will now be described with reference to FIGS. 14A, 14B, and 15. FIGS. 14A and 14B are diagrams illustrating diagnosis difficulty indexes obtained in the second method (another example of the procedure of TPI); and FIG. 15 is a diagram denoting a reason for degrading the diagnosis difficulty index in the second method.

In the example of FIG. 14A representing a status before the TPI, a logic cone (hereinafter called Ox logic cone) the vertex of which is an observation point Ox having a diagnosis difficulty index of 65 and a logic cone (hereinafter called Oy logic cone) the vertex of which is an observation point Oy having a diagnosis difficulty indexes of 35 are present. The second method does not evaluate the entire circuit to be designed as performed in the first method, but does evaluate and select a TPI point, onto which a TP is to be inserted, to minimize the diagnosis difficulty index Eox of the Ox logic cone which has the maximum diagnosis difficulty index.

As illustrated in FIG. 14B, the second method selects an optimum TP that can disperse faults only in regard of the Ox logic cone. For example, the insertion of the optimum TP makes the diagnosis difficulty index at the TP 30 and makes the diagnosis difficulty index at the observation point Ox 20. However, such TPI only in regard of the Ox logic cone has a possibility of affecting the Oy logic cone, e.g., detecting the fault which has been observed at the Ox logic cone before the TPI at the observation point Oy. This case may degrade the diagnosis difficulty index Eoy at the observation point Oy from 35 to, for example, 50.

Here, description will now be made in relation to the reason for degrading the diagnosis difficulty index in the second method with reference to FIG. 15. In the example of FIG. 15, a fault occurring in the hatched portion has been detected at the observation point Ox before the TPI, which inserts a scan latch serving as the TP. The TPI changes (improves) the controllability of the gate X, which may be followed by change (improvement) in observability of the gate Y. The improvement of observability of the gate Y changes the flow of faults and therefore a fault occurring in the hatched portion comes to be detected at the observation point Oy. This degrades the diagnosis difficulty index Eoy of the observation point Oy, so that the diagnosis difficulty index of the entire circuit to be designed is not improved and the number of test patterns is not reduced.

(2) The Design Assist Apparatus of the First Embodiment:

Ideal reduction in the number of test patterns results in decrease in the maximum diagnosis difficulty index (the number of faults) among the diagnosis difficulty indexes of all the observation points and equalization of the diagnosis difficulty indexes of all the observation points. However, the above first and second methods may unfortunately fail in selecting an optimum TP.

Considering the above, a design assist apparatus 1 of a first embodiment to be detailed below defines the number of faults detected at each observation point as a diagnosis difficulty index. Among multiple TP insertion candidates, a candidate that, when a TP is inserted thereto, minimizes the dispersion (the standard deviation) of the diagnosis difficulty indexes at all the observation points in the circuit (LSI) to be observed is selected as a TPI point onto which a TP is to be inserted. This reduces the number of test patterns and further reduces the costs for testing on the circuit after the fabrication. Alternatively, a TP insertion candidate that reduces the dispersion of the diagnosis difficulty indexes, not minimizing the dispersion, may be selected as a TPI point.

Figure 1:
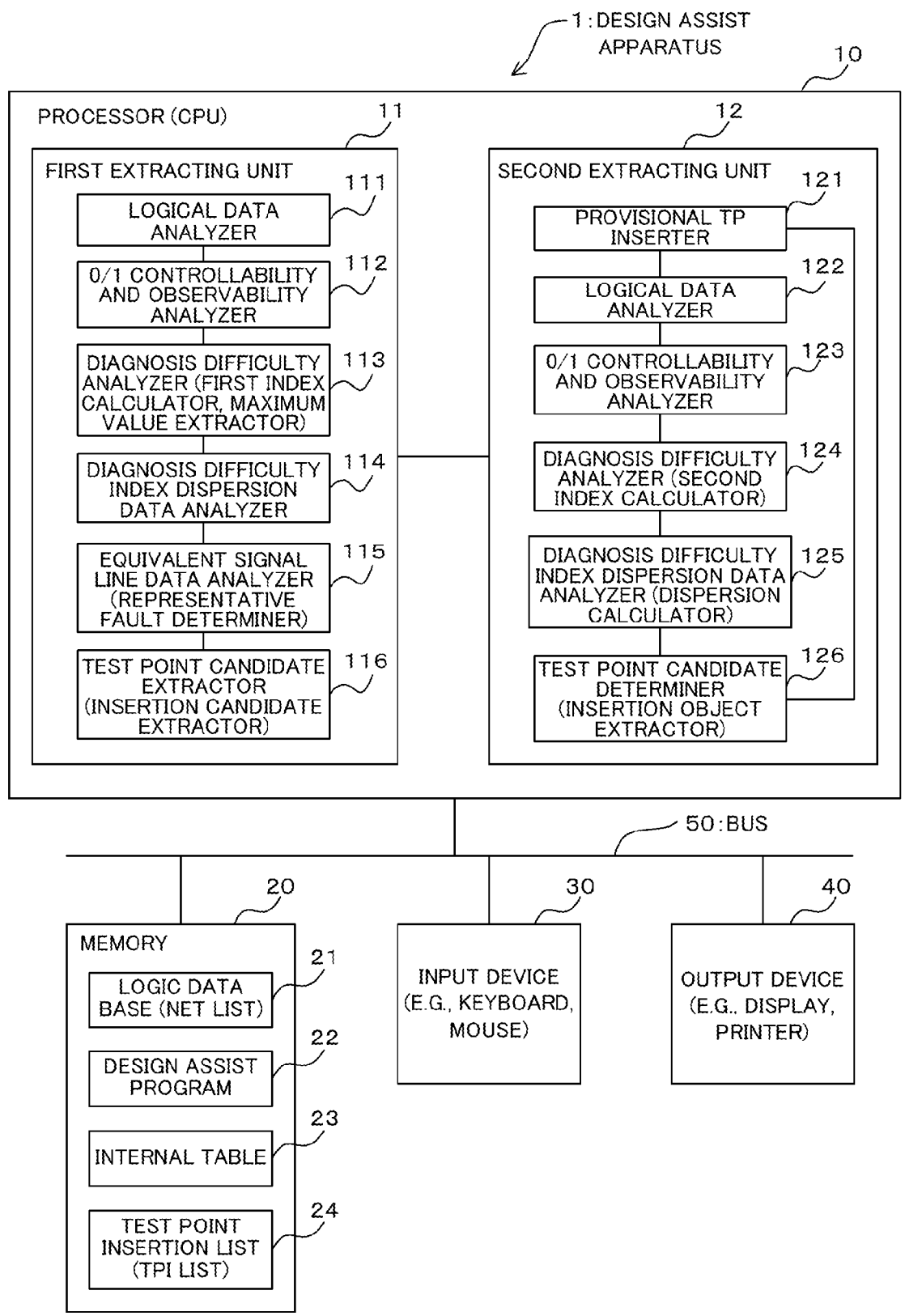
FIG. 1 is a block diagram schematically illustrating the hardware and functional configurations of a design assist apparatus according to a first embodiment.

(2-1) Configuration of the Design Assist Apparatus of the First Embodiment:

FIG. 1 is a block diagram schematically illustrating the hardware and functional configurations of the design assist apparatus 1 of the first embodiment.

The design assist apparatus 1 of FIG. 1 extracts one or more signal lines, serving as insertion candidates, onto which test points (TPs; control points or observation points) for test control are to be inserted in a circuit, such as an LSI, to be designed. In other words, the design assist apparatus 1 carries out facilitating of generation a test pattern (see step S6 in FIG. 8).

The design assist apparatus 1 includes a processor 10, a memory 20, an input device 30, and an output device 40, which are one another communicably connected via a bus 50.

The input device 30 is a man-machine interface that is operated by a user and inputs various pieces of information into the design assist apparatus 1, and is exemplified by a keyboard and/or a mouse.

The output device 40 outputs and displays results (e.g., a list 24 to be detailed below) of the processing by the apparatus 1 to the user, and is exemplified by a monitor and/or a printer.

The memory 20 stores therein a gate-level logical circuit of the circuit to be designed, i.e., a net list 21 (see logical database D3 in FIGS. 7 and 8), a design assist program 22, an internal table 23 to be described below with reference to FIG. 3, and a test point inserting list 24. For example, the memory 20 may be an internal storage device such as a Random Access Memory (RAM), a Read Only Memory (ROM), a Hard Disk Drive (HDD), and a Solid State Drive (SSD), or an external storage device.

The processor 10 functions as a first extracting unit 11 and a second extracting unit 12 that are to be detailed below by executing the design assist program 22 stored in the memory 20, and is exemplified by a Central Processing Unit (CPU), a processor, and a computer.

The first extracting unit 11 extracts first insertion candidates, which are multiple signal lines included in a circuit net the vertex of which is the observation point having the maximum diagnosis difficulty index representing the difficulty in diagnosing a fault at the corresponding observation point among the diagnosis difficulty indexes of all the observation points for observing the signal lines included in the circuit to be designed. Specifically, the first extracting unit 11 extracts multiple signal lines included in a logic cone the vertex of which is the maximum observation point having the maximum diagnosis difficulty index (i.e., the number of faults observed at each observation point) among those of all the observation points in the circuit to be designed, the extracted signal lines being regarded as TP insertion candidates (first insertion candidates). The first extracting unit 11 includes a logical data analyzer 111, a 0/1 controllability and observability analyzer 112, a diagnosis difficulty analyzer 113, a diagnosis difficulty index dispersion data analyzer 114, an equivalent signal line data analyzer 115, and a test point candidate extractor 116

The second extracting unit 12 extracts an insertion candidate signal line (second insertion candidate), onto which a TP is to be inserted, from the TP insertion candidates (first insertion candidates), considering the effects of inserting a TP onto each TP insertion candidate.

At that time, the second extracting unit 12 calculates prospective dispersion of the diagnosis difficulty indexes of all the observation points included in the circuit to be designed in which a TP is inserted into each insertion candidate, considering the effect of the inserting. Then the second extracting unit 12 may select an insertion candidate that causes, when a TP is inserted into the insertion candidate, the calculated prospective dispersion to be smaller than the dispersion of the diagnosis difficulty indexes of all the observation points in the circuit in which a TP is not inserted onto the insertion candidate as an insertion object signal line (second insertion candidate) from the TP insertion candidates. Alternatively, the second extracting unit 12 may select an insertion candidate that causes, when a TP is inserted into the insertion candidate, the calculated prospective dispersion to the smallest as an insertion object signal line (second insertion candidate) from the TP insertion candidates.

In the first embodiment, the second extracting unit 12 selects an insertion candidate that causes, when a TP is inserted into the insertion candidate, the calculated prospective dispersion to the smallest as an insertion object signal line from the TP insertion candidates extracted by the first extracting unit 11. The second extracting unit 12 has the functions of a provisional TP inserter 121, a logical data analyzer 122, a 0/1 controllability and observability analyzer 123, a diagnosis difficulty analyzer 124, a diagnosis difficulty index dispersion data analyzer 125, and a test point candidate determiner 126.

Figure 2:
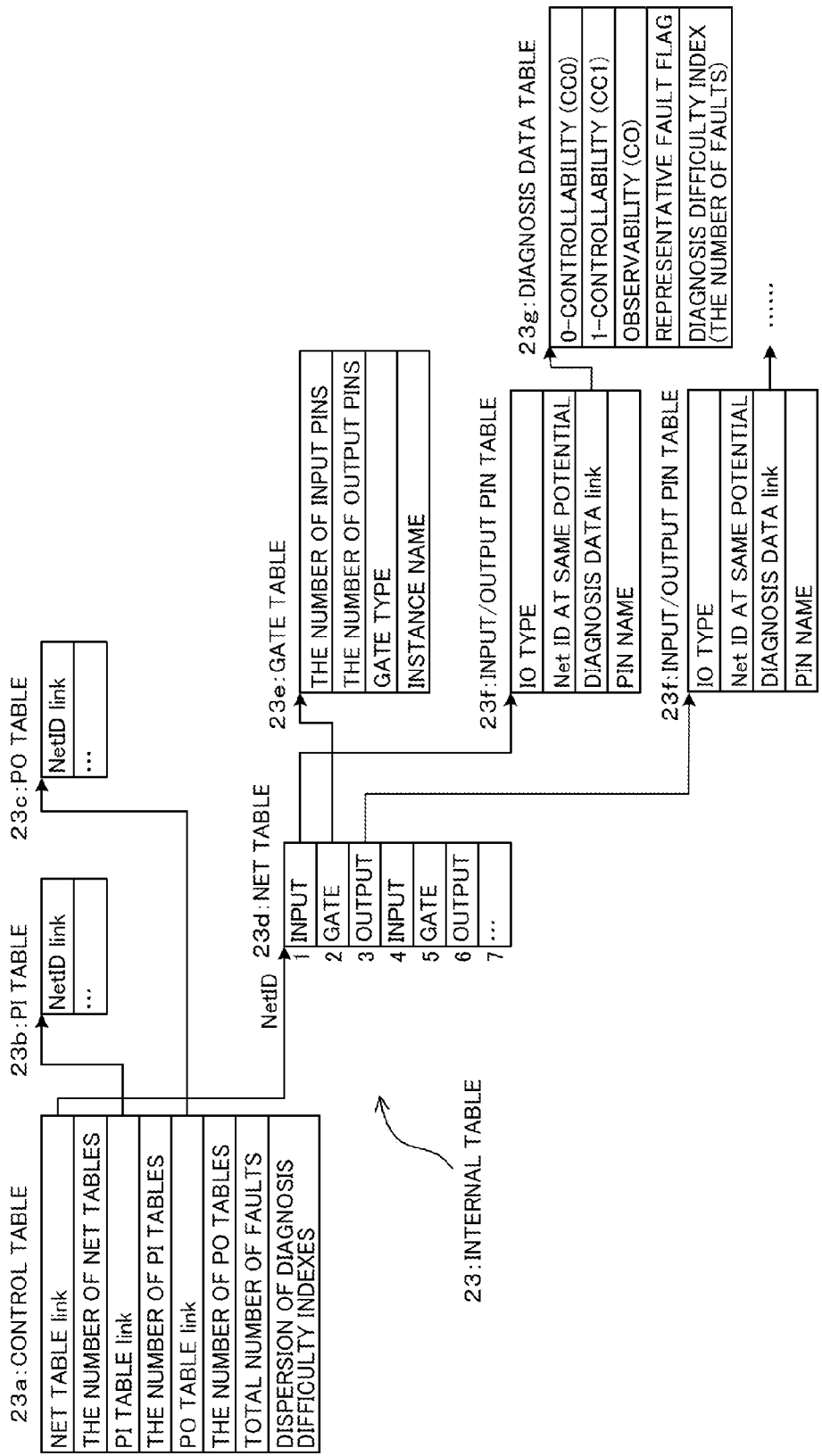
FIG. 2 is a diagram illustrating the configuration of an internal table generated by a logical data analyzer included in a design assist apparatus of FIG. 1.

The logical data analyzer 111 carries out logical data analysis based on the net list 21 of the circuit to be designed, the list being stored in the memory 20, and generates the internal table 23 of FIG. 2. FIG. 2 illustrates the configuration of the internal table 23 generated by the logical data analyzer 111 (or the logical data analyzer 122 to be detailed below). As depicted in FIG. 2, the internal table 23 includes a control table 23a, an external input (PI) table 23b, an external output (PO) table 23c, a net table 23d, a gate table 23e, an input/output pin table 23f, and a diagnosis data table 23g.

The control table 23a includes various pieces of data of the link to the net table 23d, the number of net tables 23d, the link to the PI table 23b, the number of PI tables 23b, the link to the PO table 23c, the number of PO tables 23c, and the total number of faults. In addition, the control table 23a stores therein dispersion (i.e., standard deviation σ) of diagnosis difficulty indexes calculated in the manner to be detailed below.

The PI table 23b stores therein the ID (Net ID) of a net to be connected to each PI (external input) and the PO table 23c stores therein the ID (Net ID) connected to each PO (external output).

The net table 23d is provided for each net specified by a Net ID, and stores therein data about an input pin, a gate, and an output pin that are included in the same net specified by the net ID. Data about an input pin is data about the link between the input pin and the input/output pin table 23f; data about a gate is data about the link between the gate and the gate table 23e; and data about an output pin is data about the link between the output pin and the input/output pin table 23f.

The gate table 23e stores therein data about the data including the number of input pins of the gate linked to the gate table 23e, the number of output pins of the gate, the type of the gate (e.g., AND or OR), and an instance name. The input/output pin table 23f stores therein the type of IO (input pin or output pin), Net ID at the same potential, link data to the diagnosis data table 23g, and the pin name. The diagnosis data table 23g stores therein the value CC0 representing the 0-controllability, the value CC1 representing the 1-controllability, and the value of the observability that are calculated in the manner detailed below, and a representative fault flag and a diagnosis difficulty indexes (i.e., the number of faults) that are to be detailed below.

The 0/1 controllability and observability analyzer 112 sequentially extracts net IDs from the PI table 23b and traces the signal lines in the circuit to be designed from the PI, which is corresponding to each extracted net ID and which is regarded as an origin, to the P0, referring to the net table 23d. In the tracing, the 0/1 controllability and observability analyzer 112 calculates the value CC0 representing the 0-controllability and the value CC1 representing the 1-controllability using the SCOAP method, and stores the calculated values into the diagnosis data table 23g. Furthermore, the 0/1 controllability and observability analyzer 112 subsequentially extracts the net ID from the PO table 23c, and back-traces the signal lines in the circuit to be designed from the P0, which is corresponding to each extracted net ID and which is regarded as an origin, to the PI, referring to the net table 23d. In the back-tracing, the 0/1 controllability and observability analyzer 112 calculates the value CO representing the observability of each of the input pins and the output pins in the SCOAP method, and stores the calculated values into the diagnosis data table 23g.

The diagnosis difficulty analyzer 113 has the functions of a first index calculator that calculates the diagnosis difficulty indexes of all the observation points and a maximum value extractor that extracts the maximum value from the diagnosis difficulty indexes calculated by the first index calculator. Specifically, the diagnosis difficulty analyzer 113 sets faults F1, . . . , and Fn one for each of all the signal lines P1, . . . , and Pn included in the circuit to be designed. The diagnosis difficulty analyzer 113 further propagates the fault set in each signal line to the observation points O1, . . . , and Om, using the values CC0, CC1, and CO which are stored in the diagnosis data table 23g and which respectively represent the 0-controllability, the 1-controllability, and the observability. Then, the diagnosis difficulty analyzer 113 counts the number of faults propagated to each observation point, which is regarded as the diagnosis difficulty index E1, . . . , and Em of the observation point, and stores the calculated diagnosis difficulty index E1, . . . , and Em into the diagnosis data table 23g. The diagnosis difficulty analyzer 113 further extracts the maximum diagnosis difficulty index Emax from the calculated diagnosis difficulty indexes E1, . . . , and Em.

The diagnosis difficulty index dispersion data analyzer 114 obtains the diagnosis data tables 23g one for each of all the observation points O1, . . . , and Om by referring to the PO table 23c, and obtains the diagnosis difficulty indexes E1, . . . , and Em of all the observation points O1, . . . , and Om. The diagnosis difficulty index dispersion data analyzer 114 calculates the standard deviation σ of the diagnosis difficulty indexes E1, . . . , and Em, the standard deviation σ being regarded as the dispersion of the diagnosis difficulty indexes, and stores the calculated standard deviation σ in the control table 23a. The dispersion (standard deviation σ) calculated by the diagnosis difficulty index dispersion data analyzer 114 is used as the initial value of the dispersion in the determination to be made by the test point candidate determiner 126, which will be detailed below.

The equivalent signal line data analyzer (representative fault determiner) 115 determines whether each signal line in the circuit to be designed is a representative fault signal line that considers an equivalent faults. This means that the equivalent signal line data analyzer 115 selects and optimizes a signal line which can be a candidate for inserting a TP thereto in order to shorten the time for TPI evaluation. This selection and optimization aims at reducing a delay buffer to adjust the timing. Here, equivalent faults are faults detected in the same test pattern, and a representative faults is one selected from a group of equivalent faults.

Figure 3:
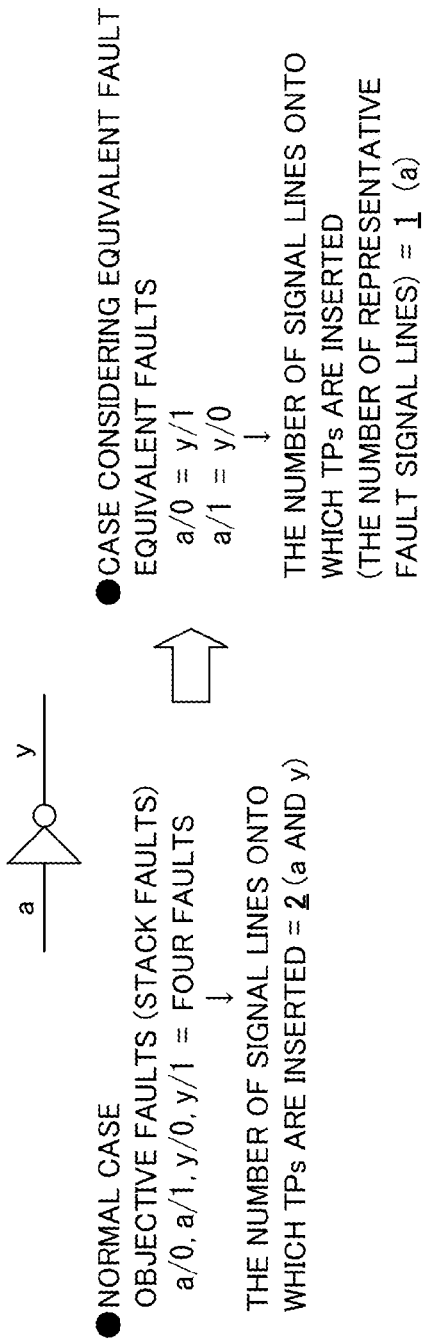
FIG. 3 is a diagram illustrating the number of representative fault signals considering equivalent faults.

Referring to FIG. 3, description will now be made in relation to the number of signal lines each onto which a TP is to be inserted (i.e., the number of representative fault signal lines) in a case where equivalent faults are considered and in a case where equivalent faults are not considered. In the circuit of FIG. 3, in a normal case (where equivalent faults are not considered), there are four objective faults (stack faults) a/0, a/1, y/0, and y/1, and two signal lines a and y of candidates for inserting a TP therein. In contrast, in a case where equivalent faults are considered in the circuit of FIG. 3, there are two equivalent faults understood from the relationship of a/0=y/1 and a/1=y/0, and a single signal a that represents the number of signal lines onto which a TP is to be inserted (i.e., the number of representative fault signal lines).

The equivalent signal line data analyzer 115 determines whether each of the input pins and the output pins has a representative fault, and if determining that the pin has a representative fault, the equivalent signal line data analyzer 115 sets a representative fault signal flag in the diagnosis data table 23g provided for the pin in question. The flag is used to reduce the number of signal lines to be evaluated in the test point candidate extractor 116, as to be detailed below.

The test point candidate extractor (insertion candidate extractor) 116 selects multiple signal lines in a logic cone the vertex of which is the maximum observation point Ox having the maximum diagnosis difficulty index Emax extracted by the diagnosis difficulty analyzer 113 as insertion candidates (first insertion candidates). Here, the test point candidate extractor 116 selects one or more signal lines that the equivalent signal line data analyzer 115 determines to be representative fault signal lines as the insertion candidates among the multiple signal lines in the logic cone. Namely, the test point candidate extractor 116 obtains a logic cone the vertex of which is the maximum observation point Ox having the maximum diagnosis difficulty index by back-tracing the signal lines from the maximum observation point Ox to the control point or the input point Ix. Then the test point candidate extractor 116 obtains a set Q containing multiple signal lines in the obtained logic cone, and generates a set Q' by removing signal lines except for representative fault signal lines from the set Q, referring to the representative fault signal flag in the diagnosis data tables 23g. The signal lines belonging to the set Q' are insertion candidates for TPI.

The provisional TP inserter 121 extracts a TPI candidate (signal line) from the set Q' and provisionally inserts a TP onto the extracted signal line Py. The logical data analyzer 122, the 0/1 controllability and observability analyzer 123, the diagnosis difficulty analyzer 124, and the diagnosis difficulty index dispersion data analyzer 125 perform, on the circuit in which a TP is provisionally inserted into the signal line PY, the same processes as those performed by the logical data analyzer 111, the 0/1 controllability and observability analyzer 112, the diagnosis difficulty analyzer 113, and the diagnosis difficulty index dispersion data analyzer 114, respectively.

This means that the logical data analyzer 122 carries out logical data analysis on the net list of the circuit in which a TP is provisionally inserted into the signal line Py and thereby generates an internal table 23 depicted in FIG. 2.

Similarly to the 0/1 controllability and observability analyzer 112, the 0/1 controllability and observability analyzer 123 calculates the values CC0, CC1, and CO representing the 0-controllability, the 1-controllability, and the observability of each of all the signal lines P1, . . . , and Pn+1 of the circuit to be designed using the data stored in the internal table 23 and the SCOAP method, and stores the calculated values into the diagnosis data tables 23g.

The diagnosis difficulty analyzer 124 functions as a second index calculator 124 that calculates, when a TP is provisionally inserted onto a signal line (TP insertion candidate) among those in the set Q', the diagnosis difficulty indexes of all the observation points, considering the effects of the TP provisionally inserted. Specifically, the diagnosis difficulty analyzer 124 sets faults F1, . . . , and Fn+1 one for each of all the signal lines P1, . . . , and Pn+1 in the circuit to be designed. Furthermore, the diagnosis difficulty analyzer 124 propagates a fault set in each signal line to the observation points O1, . . . , Om+1 using the values CC0, CC1, and CO respectively representing the 0-controllability, the 1-controllability, and the observability stored in the corresponding diagnosis data table 23g. The diagnosis difficulty analyzer 124 calculates the number of faults propagated to each observation point and calculates the number E'1, . . . , and E'm+1 of faults observed in each of the observation points, which number is regarded as the diagnosis difficulty index of the observation point.

The diagnosis difficulty index dispersion data analyzer (dispersion calculator) 125 calculates the standard deviation σ' of the diagnosis difficulty indexes E'1, . . . , and E'm+1 at all the observation points O1, . . . , and Om+1 in the circuit in which a TP is provisionally inserted, which indexes are calculated by the diagnosis difficulty analyzer 124, and regards the calculated standard deviation σ as the deviation of the diagnosis difficulty indexes E'1, . . . , and E'm+1.

The test point candidate determiner (insertion object extractor) 126 selects a TP insertion candidate, which causes the standard deviation σ' calculated by the diagnosis difficulty index dispersion data analyzer 125 when a TP is provisionally inserted onto the TP insertion candidate to be the smallest, among the TP insertion candidates (signal lines) extracted so as to belong to the set Q' by the first extracting unit 11. Specifically, the test point candidate determiner 126 compares the standard deviation a' calculated by the diagnosis difficulty index dispersion data analyzer 125 and the minimum standard deviation σ obtained before the standard deviation σ' is calculated to determine whether the standard deviation σ' is smaller than the standard deviation G. If the standard deviation σ' is smaller than the standard deviation σ, which seems that faults that have been concentrated on a particular observation point are dispersed to observation points over the entire circuit to be designed, the test point candidate determiner 126 selects the signal line Py for a TPI point onto which a TP is to be inserted and set the latest standard deviation σ' to the standard deviation G. In contrast, when the standard deviation σ' is equal to or more than the standard deviation σ, the test point candidate determiner 126 does not substitute the latest standard deviation σ' for the standard deviation σ. The initial value of the standard deviation a for determination made by the test point candidate determiner 126 is the dispersion (standard deviation σ) calculated by the diagnosis difficulty index dispersion data analyzer 114.

In the second extracting unit 12, the provisional TP inserter 121, the logical data analyzer 122, the 0/1 controllability and observability analyzer 123, the diagnosis difficulty analyzer 124, the diagnosis difficulty index dispersion data analyzer 125, and the test point candidate determiner 126 perform the same processing as the above on all the TPI candidates belonging to the set Q'. As a result, a signal line that causes the standard deviation σ of the diagnosis difficulty indexes of all the observation points in the circuit to be designed when a TP is inserted into the signal line to be the smallest is selected a signal line onto which a TP is to be inserted among the TPI candidates belonging to the set Q'.

Figure 4:
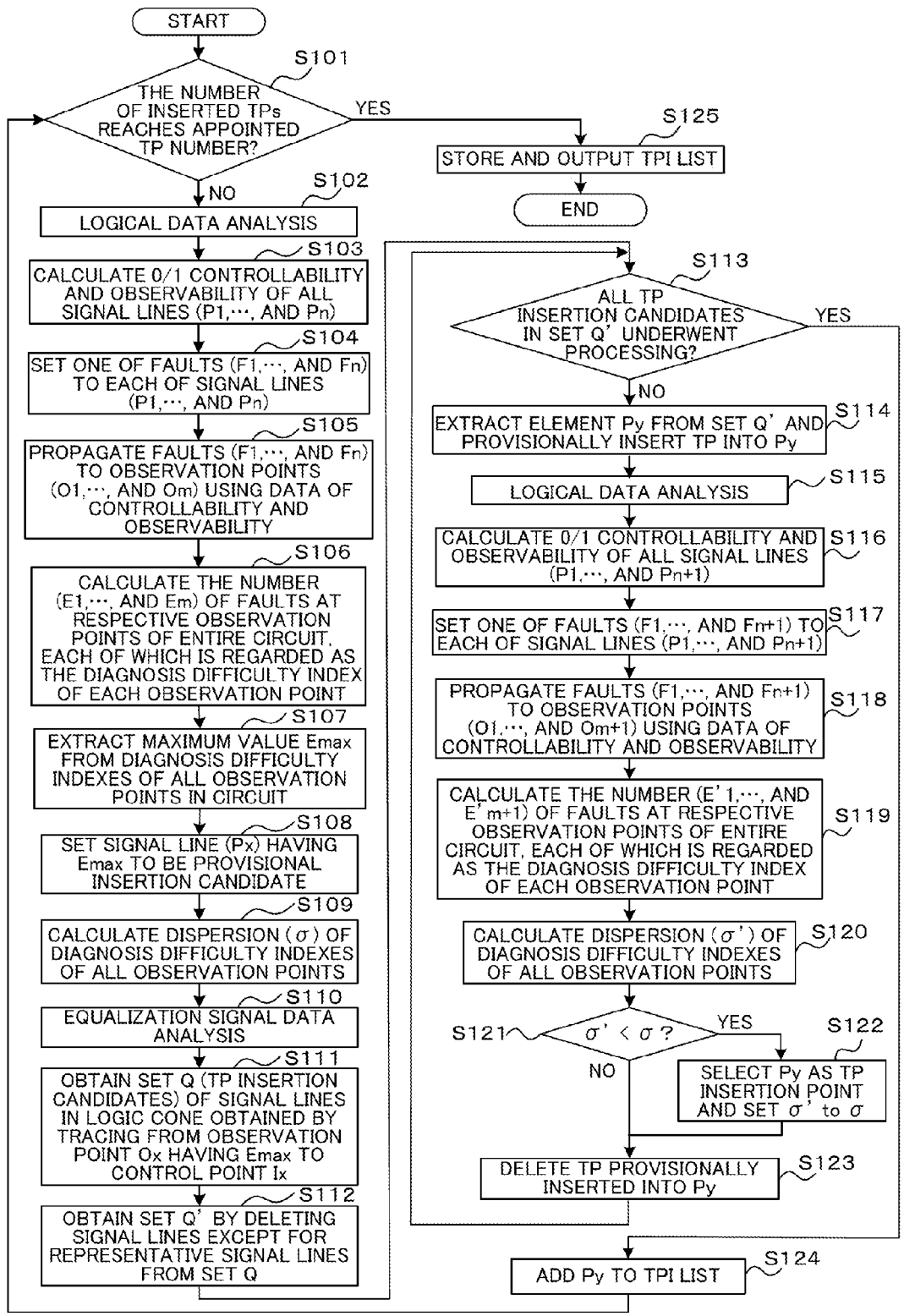
FIG. 4 is a flow diagram denoting a succession of procedural steps of operation performed in a design assist apparatus of FIG. 1.

(2-2) Operation of the Design Assist Apparatus of the First Embodiment:

Next, description will now be made in relation to the operation performed in the above design assist apparatus 1 with reference to the flow diagrams (steps S101 to S125) of FIG. 4.

First, the processor 10 determines whether the number of inserted TPs reaches an appointed TP number that are predetermined (step S101). If the number of inserted TPs does not reach an appointed TP number (NO route in step S101), the logical data analyzer 111 carries out logical data analysis based on the net list 21, and consequently generates the internal table 23 depicted in FIG. 2 (step S102).

After the internal table 23 is generated, the 0/1 controllability and observability analyzer 112 calculates the values of CC0, CC1, and CO respectively representing the 0-controllabilty, the 1-controllability, and the observability of each of all the signal lines P1, . . . , and Pn in the circuit to be designed, using data in the generated internal table 23 and the SCOAP method, and stores the calculated values to the diagnosis data tables 23g (step S103).

Next, the diagnosis difficulty analyzer 113 sets faults F1, . . . , and Fn one for each of all the signal lines P1, . . . , and Pn in the circuit to be designed (step S104), and propagates a fault set for each signal line to the observation points O1, . . . , and Om using the 0-controllability, the 1-controllability, and the observability calculated in step S103 (step S105). Then, the diagnosis difficulty analyzer 113 counts the number of faults propagated to each observation point, and calculates the number E1, . . . , and Em of faults at respective observation points, which are regarded as the diagnosis difficulty indexes (step S106). Furthermore, the diagnosis difficulty analyzer 113 selects the maximum value Emax among the diagnosis difficulty indexes E1, . . . , and Em of all the observation points in the circuit to be designed (step S107), and determines a signal line Px having the maximum value Emax to be a provisional TPI candidate, onto which a TP is to be inserted (step S108).

The above first method regards the ratio of the number of faults observed at each observation point to the total number of faults observed in the entire circuit as the diagnosis difficulty index of the observation point while the first embodiment regards the absolute number of faults observed at each observation point as the diagnosis difficulty index of the observation point. Since determining a ratio of faults as performed in the first method takes processing cost in the calculation, the first embodiment reduces the processing cost in the calculation by using the absolute number of faults as a diagnosis difficulty index. The meaning of the diagnosis difficulty index in the first embodiment is unchanged from that of the first method.

Next, the diagnosis difficulty index dispersion data analyzer 114 calculates the standard deviation σ of the diagnosis difficulty indexes E1, . . . , and Em of all the observation points (i.e., the number of faults of each observation point) and regards the calculated standard deviation σ as the dispersion of the diagnosis difficulty indexes (step S109). The dispersion (i.e., the standard deviation σ) calculated in this step is used as the initial value in the determination to be made by the test point candidate determiner 126 in the following step S121.

Then, the equivalent signal line data analyzer 115 determines whether each of input pins and output pins has a representative fault, and if the pin has a representative fault, sets the representative fault signal flag of the pin in the corresponding diagnosis data table 23g (step S110).

After that, the test point candidate extractor 116 obtains a logic cone the vertex of which is the maximum observation point Ox having the maximum diagnosis difficulty index Emax extracted by the diagnosis difficulty analyzer 113 by back-tracing the signal lines from the maximum observation point Ox to the control point or the input point Ix. Then the test point candidate extractor 116 obtains multiple signal lines in the obtained logic cone and regards the obtained signal lines to be a set Q of TPI candidates (step S111). The test point candidate extractor 116 further refers to the representative fault signal flags in the respective diagnosis data tables 23g and generates a set Q' by removing one or more signal lines except for the representative fault signal lines from the set Q (step S112). The signal lines belonging to the set Q' are the TPI candidates. This makes it possible to reduce the number of signal line that is to be evaluated as TPI candidates and further reduce the time for processing.

The provisional TP inserter 121 determines whether all the TPI candidates in the set Q' underwent the processing (step S113). If a signal line (i.e., signal line of a TPI candidate) not undergoing the processing is left (No route in step S113), the provisional TP inserter 121 extracts a signal line Py not undergoing the processing from the set Q' and provisionally inserts a TP onto the extracted signal line Py (step S114). The procedure of the above steps S102-S106 and S109 are carried out on the circuit in which a TP is provisionally inserted onto the signal line Py (steps S115 to S120).

Specifically, the logical data analyzer 122 carries out logical data analysis based on the net list 21 concerning the circuit in which a TP is inserted in a signal line Py, and consequently generates the internal table 23 depicted in FIG. 2 (step S115). The 0/1 controllability and observability analyzer 123 calculates the values of CC0, CC1, and CO respectively representing the 0-controllabilty, the 1-controllability, and the observ-ability of each of all the signal lines P1, . . . , and Pn+1 in the circuit to be designed, using data in the generated internal table 23 and the SCOAP method, and stores the calculated values to the diagnosis data table 23g (step S116). Then, the diagnosis difficulty analyzer 124 sets faults F1, . . . , and Fn+1 one for each of all the signal lines P1, . . . , and Pn+1 in the circuit to be designed (step S117). The diagnosis difficulty analyzer 124 propagates a fault set for each signal line to the observation points O1, . . . , and Om+1 using the 0-controllability, the 1-controllability, and the observability stored in the diagnosis data table 23g (step S118). The diagnosis difficulty analyzer 124 counts the number of faults propagated to each observation point, and calculates the number E'1, . . . , and E'm+1 of faults observed at respective observation points, which are regarded as the diagnosis difficulty indexes (step S119). Furthermore, the diagnosis difficulty index dispersion data analyzer 125 calculates the standard deviation σ' of the diagnosis difficulty indexes E'1, . . . , and E'm+1 of all the observation points O1, . . . , Om+1 in the circuit in which a TP is provisionally inserted onto the signal line Py and regards the calculated standard deviation σ' to be the dispersion of all the diagnosis difficulty indexes (step S120).

Then, the test point candidate determiner 126 compares the standard deviation σ' calculated in step S120 and the minimum standard deviation σ obtained before the standard deviation σ' is calculated to determine whether the standard deviation σ' is smaller than the standard deviation σ (step S121). If the standard deviation σ' is smaller than the standard deviation σ (Yes route in step S121), the test point candidate determiner 126 selects the signal line Py as a point where a TP is to be inserted because faults that have been concentrated on a particular observation point are dispersed the observation points over the entire circuit. The test point candidate determiner 126 substitutes the latest standard deviation σ' for the standard deviation σ (step S122). Then the TP provisionally inserted onto the signal line Py is deleted (step S123). If the standard deviation σ' is equal to or larger than the standard deviation σ (NO route in step S121), step S122 is skipped and the TP provisionally inserted onto the signal line Py is deleted (step S123). The initial value of the standard deviation σ is the standard deviation σ extracted in step S109.

After that, the procedure of steps S113 to S123 is repeated until all the TPI candidates (signal lines) in the set Q' are determined to have undergone the processing in step S113. If all the TPI candidates (signal lines) in the set Q' are determined to have undergone the processing in step S113 (YES route in step S113), a signal line Py which is ultimately selected as a TPI point is added to the TPI list 24 (step S124) and the procedure returns to step S101.

Thereby, the diagnosis difficulty indexes can be evaluated on all the signal line in the set Q', that is, signal lines in a logic cone the vertex of which is the maximum observation point Ox having the maximum diagnosis difficulty index among all the observation point in the circuit to be designed except for signal lines not being a representative fault signal lines. This means that a signal line Py which causes the standard deviation of the diagnosis difficulty indexes of all the observation points in the circuit in which a TP is inserted onto the signal line Py to be the smallest is determined to be the TPI point among the set Q'. Accordingly, faults that have been concentrated on a particular observation point are dispersed to the observation points in the entire circuit to be designed, so that the number of test patterns and the cost for testing both can be reduced.

The procedure of steps S101 to S124 is repeated until the number of inserted TPs is determined to reach the appointed TP number in step S101. If the number of inserted TPs does not reach the appointed TP number yet (NO route in step S101), the above procedure (steps S102 to S124) are carried out using the net list in which TPs that are already inserted are reflected. On the other hand, if the number of inserted TPs reaches the appointed TP number (YES route in step S101), the TPI list 24 is stored in the memory 20 (step S125) and the TPI process, i.e., facilitating of generation a test pattern is completed. The TPI list 24 may be displayed and printed by the output device 40.

(2-3) Effects of the Design Assist Apparatus of the First Embodiment:

As described above, the design assist apparatus 1 of the first embodiment determines a signal line Py which causes the standard deviation of the diagnosis difficulty indexes of all the observation points in the circuit in which a TP is inserted onto the signal line Py to be the smallest is determined to be the TPI point among the signal lines (TPI candidates) belonging to the set Q'. Namely, a TPI point which minimizes the dispersion (standard deviation σ) of the number of faults observed at the respective observation points is evaluated and selected, and TPI onto such a TPI point reduces the dispersion of the diagnosis difficulty indexes of all the observation points of the circuit to be tested.

This makes it possible to disperse faults that have been concentrated on a particular observation point to observation points over the entire circuit to be designed, so that the maximum diagnosis difficulty index can be reduced and the diagnosis difficulty indexes of all the observation point can be equalized. Accordingly, the design assist apparatus 1 of the first embodiment is capable of selecting a TPI point that effectively reduces the number of test patterns in a circuit for which the above first and the second methods are each incapable of selecting an effective TPI point, and consequently, insertion of such a TP selected in the manner of the first embodiment can reduce the number of test patterns and reducing cost for testing.

Figure 5A:
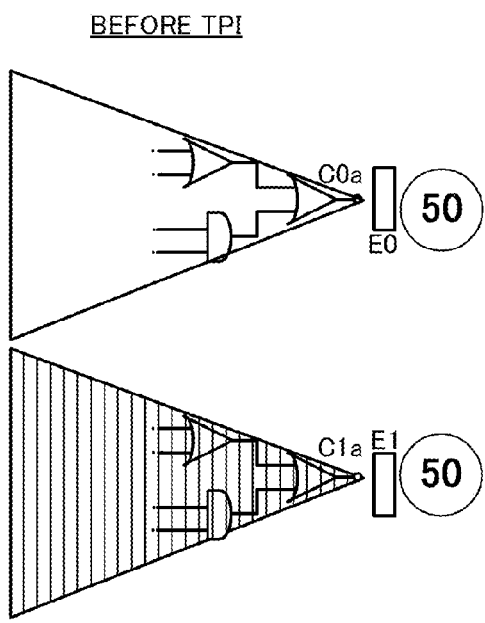
FIGS. 5A to 5C are diagrams illustrating a diagnosis difficulty indexes obtained by a first method denoted in FIGS. 12 and 13B and a diagnosis difficulty indexes obtained by the method of the first embodiment, comparing with each other.
Figure 5B:
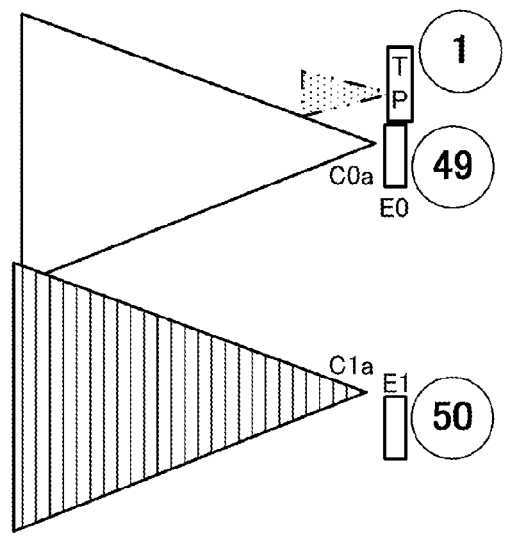
Figure 5C:
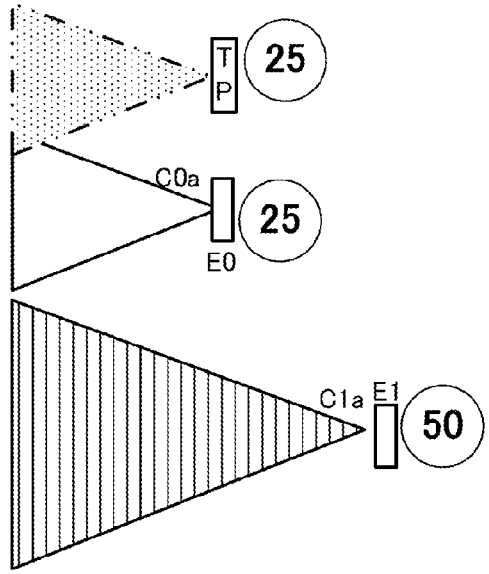
Figure 6A:
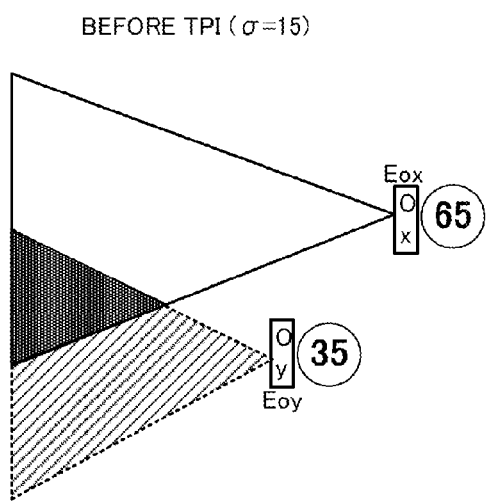
FIGS. 6A to 6C are diagrams illustrating a diagnosis difficulty index obtained by a first method denoted in FIGS. 14B and 15 and a diagnosis difficulty indexes obtained by the method of the first embodiment, comparing with each other.
Figure 6B:
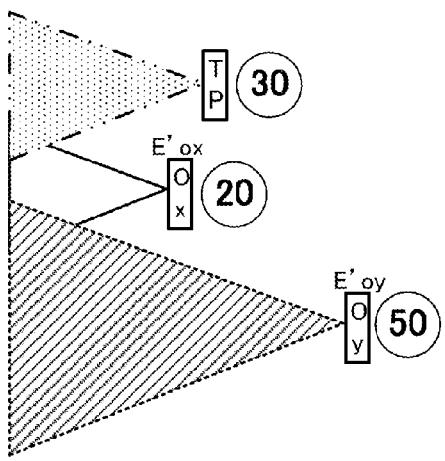
Figure 6C:
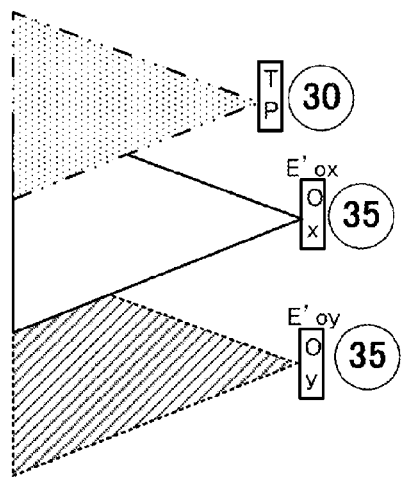

Here, FIGS. 5A to 5C are diagrams comparing diagnosis difficulty indexes obtained by the first method of FIGS. 12 and 13B and those obtained in the method of the first embodiment. FIGS. 6A to 6C are diagrams comparing diagnosis difficulty indexes obtained by the second method of FIGS. 14B and 15 and those obtained in the method of the first embodiment.

FIGS. 5A and 5B are the same as FIGS. 13A and 13B, respectively. In application of the first method to the circuit illustrated in FIG. 5A, the first method is not allowed to select a signal line that is to optimally reduce the number of test patterns and that is included in a desired logic cone C0a as a TPI point as detailed the above with reference to FIG. 5B. In FIG. 5B, the standard deviation σ of 1, 49, and 50 each representing the number of faults observed at one of three observation point is 22.9. In contrast, in application of the method of the first embodiment to the circuit illustrated in FIG. 5A, the diagnosis difficulty indexes of the observation point at the vertex of a logic cone C1a remains 50 but a TP can be inserted onto a point in a logic cone C0a such that the standard deviation σ of the number of faults observed at each of all the observation points comes to be the smallest. This makes it possible to select a signal line that is to optimally reduce the number of test patterns and that is included in a desired logic cone C0a as a TPI point, and for example, the desired logic cone C0a is divided into two logic cones each having the diagnosis difficulty index of 25. In FIG. 5C, the standard deviation σ of 25, 25 and 50 each representing the number of faults observed at one of three observation point is 11.8.

FIGS. 6A and 6B are the same as FIGS. 14A and 14B, respectively. In application of the second method to the circuit illustrated in FIG. 6A, the second method is capable of selecting an optimum TP that disperses faults within the scope of the Ox logic cone, but has a possibility that a fault that has observed at the observation point Ox before the TPI flows into the observation point Oy as described the above with reference to FIG. 6B. Here, the standard deviation σ of 65 and 35 each representing the number of faults observed at one of two observation point is 15; and the standard deviation σ of 30, 20 and 50 each representing the number of faults observed at one of three observation point is 12.5. In contrast, application of the method of the first embodiment to the circuit illustrated in FIG. 6A disperses faults to three observation points such that the number of faults observed at the respective observation fault are equalized as depicted in FIG. 6C. In FIG. 6C, the standard deviation σ of 30, 35, and 35 each representing the number of faults observed at one of three observation point is 2.4.

The design assist apparatus 1 of the first embodiment generates the set Q' by removing signal lines except for the representative fault signal line from the set Q of the TPI candidates, and regards the signal lines belonging to the set Q' as the TPI candidate. This makes it possible to reduce the number of signal lines being regarded as TPI candidate to be evaluated and reducing the time for processing.

The first embodiment uses the absolute number of faults observed at each observation point as the diagnosis difficulty index. This reduces the processing cost for calculation as compared with the first method and the second method each of which uses the ratio of fault at each observation point to the total fault and consequently takes more cost.

(3) Others:

Hereinafter, a preferred embodiment of the present invention is detailed, but the present invention should by no means be limited to the above first embodiment. Various changes and modifications can be suggested without departing from the sprit of the present invention.

The entire or part of the function of the first extracting unit 11 (the logical data analyzer 111, the 0/1 controllability and observability analyzer 112, the diagnosis difficulty analyzer 113, the diagnosis difficulty index dispersion data analyzer 114, the equivalent signal line data analyzer 115, and the test point candidate extractor 116), and the second extracting unit 12 (the provisional TP inserter 121, the logical data analyzer 122, the 0/1 controllability and observability analyzer 123, the diagnosis difficulty analyzer 124, the diagnosis difficulty index dispersion data analyzer 125, and the test point candidate determiner 126) is achieved by a computer (including a CPU, an information processing apparatus, and various terminals) executing a predetermined application program (e.g., design assist program).

The above program is provided in the form of being stored in a computer-readable recording medium such as a flexible disk, a CD (e.g., CD-ROM, CD-R, and CD-RW), a DVD (e.g., DVD-ROM, DVD-RAM, DVD-R, DVD-RW, DVD+R, and DVD+RW), and Blu-ray disk. The computer reads the program from the recording medium and stores the program into an internal or external memory for future use.

According to the above first embodiment, insertion of a test point reduces the dispersion of diagnosis difficulty indexes of all the observation points included in a circuit to be tested.

All examples and conditional language recited herein are intended for the pedagogical purposes of aiding the reader in understanding the invention and the concepts contributed by the inventor to further the art, and are not to be construed limitations to such specifically recited examples and conditions, nor does the organization of such examples in the specification relate to a showing of the superiority and inferiority of the invention. Although one or more embodiments of the present inventions have been described in detail, it should be understood that the various changes, substitutions, and alterations could be made hereto without departing from the spirit and scope of the invention.

What is claimed is:

1. A design assist apparatus comprising a processor that selects, as an insertion candidate, a signal line onto which a test point for test controlling is to be inserted and which is included in a circuit to be designed, wherein the processor:
   selects first insertion candidates being a plurality of signal lines in a circuit net the vertex of which is a maximum observation point having a maximum diagnosis difficulty index among a plurality of diagnosis difficulty indexes of all the observation points that are used for observing signal lines in the circuit, each of the plurality of diagnosis difficulty indexes of the observation points representing the difficulty in fault diagnosis at the corresponding observation point; and
   selects a second insertion candidate onto which the test point is to be inserted from the first insertion candidates, considering effects of inserting the test point onto the respective first insertion candidates,
   wherein the processor further:
   calculates prospective dispersion of the plurality of diagnosis difficulty indexes of all the observation points, considering an effect of inserting the test point onto each of the first insertion candidates; and
   selects, as the second insertion candidate, one or more insertion candidates each of which causes the calculated prospective dispersion when the test point is inserted onto the insertion candidate to be smaller than dispersion of the plurality of diagnosis difficulty indexes of all the observation points before the test point is inserted, from the first insertion candidates.

2. The design assist apparatus according to claim 1, wherein the circuit net corresponds to a logic cone obtained by back-tracing signal lines from the maximum observation point to an input point into which a value set in the circuit is to be input or to a control point into which a value in the circuit is settable.

3. The design assist apparatus according to claim 1, wherein the plurality of diagnosis difficulty indexes is each the number of faults observed at the corresponding observation point.

4. The design assist apparatus according to claim 1, wherein the processor selects, when there is an insertion candidate already selected, a new insertion candidate of a test point using the circuit in which the test point is already inserted onto the insertion candidate already selected.

5. A design assist apparatus comprising a processor that selects, as an insertion candidate, a signal line onto which a test point for test controlling is to be inserted and which is included in a circuit to be designed, wherein the processor:
   selects first insertion candidates being a plurality of signal lines in a circuit net the vertex of which is a maximum observation point having a maximum diagnosis difficulty index among a plurality of diagnosis difficulty indexes of all the observation points that are used for observing signal lines in the circuit, each of the plurality of diagnosis difficulty indexes of the observation points representing the difficulty in fault diagnosis at the corresponding observation point; and
   selects a second insertion candidate onto which the test point is to be inserted from the first insertion candidates, considering effects of inserting the test point onto the respective first insertion candidates,
   wherein the processor further:
   calculates prospective dispersion of the plurality of diagnosis difficulty indexes of all the observation points, considering an effect of inserting the test point onto each of the first insertion candidates; and
   selects, as the second insertion candidate, an insertion candidate that causes the calculated prospective dispersion when the test point is inserted onto the insertion candidate to be the smallest, from the first insertion candidates.

6. A design assist apparatus comprising a processor that selects, as an insertion candidate, a signal line onto which a test point for test controlling is to be inserted and which is included in a circuit to be designed, wherein the processor:
   selects first insertion candidates being a plurality of signal lines in a circuit net the vertex of which is a maximum observation point having a maximum diagnosis difficulty index among a plurality of diagnosis difficulty indexes of all the observation points that are used for observing signal lines in the circuit, each of the plurality of diagnosis difficulty indexes of the observation points representing the difficulty in fault diagnosis at the corresponding observation point; and
   selects a second insertion candidate onto which the test point is to be inserted from the first insertion candidates, considering effects of inserting the test point onto the respective first insertion candidates,
   wherein the processor further:
   calculates the plurality of diagnosis difficulty indexes of all the observation points;
   selects a maximum diagnosis difficulty index from the plurality of diagnosis difficulty indexes calculated; and
   selects, as the first insertion candidates, one or more signal lines included in the circuit net the vertex of which is the maximum observation point having the selected maximum diagnosis difficulty index.

7. The design assist apparatus according to claim 6, wherein the processor further:
   determines whether each signal line in the circuit to be designed is a representative fault signal line that considers an equivalent fault; and
   selects, as the first insertion candidates, one or more signal lines each determined to be the representative fault signal line.

8. A design assist apparatus comprising a processor that selects, as an insertion candidate, a signal line onto which a test point for test controlling is to be inserted and which is included in a circuit to be designed, wherein the processor:
   selects first insertion candidates being a plurality of signal lines in a circuit net the vertex of which is a maximum observation point having a maximum diagnosis difficulty index among a plurality of diagnosis difficulty indexes of all the observation points that are used for observing signal lines in the circuit, each of the plurality of diagnosis difficulty indexes of the observation points representing the difficulty in fault diagnosis at the corresponding observation point; and
   selects a second insertion candidate onto which the test point is to be inserted from the first insertion candidates, considering effects of inserting the test point onto the respective first insertion candidates,
   wherein the processor further:
   calculates, when the test point is provisionally inserted into each of the first insertion candidates, the plurality of diagnosis difficulty indexes of all the observation points, considering effect of provisionally inserting the test point onto the first insertion candidate;
   calculates dispersion of the plurality of diagnosis difficulty indexes calculated; and selects, as the second candidate, an insertion candidate that causes the calculated dispersion to be the smallest, from the first insertion candidates.

9. The design assist apparatus according to claim 8, wherein the dispersion is a standard deviation of the plurality of diagnosis difficulty indexes of all the observation points calculated when the test point is provisionally inserted.

10. A computer-implemented method for design assist that selects, as an insertion candidate, a signal line onto which a test point for test controlling is to be inserted and which is included in a circuit to be designed, the method comprising:
    selecting, using a computer, first insertion candidates being a plurality of signal lines in a circuit net the vertex of which is a maximum observation point having a maximum diagnosis difficulty index among a plurality of diagnosis difficulty indexes of all the observation points that are used for observing signal lines in the circuit, each of the plurality of diagnosis difficulty indexes of the observation points representing the difficulty in fault diagnosis at the corresponding observation point; and
    selecting a second insertion candidate onto which the test point is to be inserted from the first insertion candidates, considering effects of inserting the test point onto the respective first insertion candidates
    wherein the selecting of the second insertion candidate comprising:
    calculating prospective dispersion of the plurality of diagnosis difficulty indexes of all the observation points, considering an effect of inserting the test point onto each of the first insertion candidates; and
    selecting, as the second insertion candidate, one or more insertion candidates each of which causes the calculated prospective dispersion when the test point is inserted onto the insertion candidate to be smaller than dispersion of the plurality of diagnosis difficulty indexes of all the observation points before the test point is inserted, from the first insertion candidates.

11. The computer-implemented method according to claim 10, wherein the selecting of the second insertion candidate comprising:
    calculating prospective dispersion of the plurality of diagnosis difficulty indexes of all the observation points, considering an effect of inserting the test point onto each of the first insertion candidates; and
    selecting, as the second insertion candidate, an insertion candidate that causes the calculated prospective dispersion when the test point is inserted onto the insertion candidate to be the smallest, from the first insertion candidates.

12. The computer-implemented method according to claim 10, wherein the selecting of the first insertion candidates comprising:
    calculating the plurality of diagnosis difficulty indexes of all the observation points;
    selecting a maximum diagnosis difficulty index from the plurality of diagnosis difficulty indexes calculated; and
    selecting, as the first insertion candidates, one or more signal lines included in the circuit net the vertex of which is the maximum observation point having the selected maximum diagnosis difficulty index.

13. The computer-implemented method according to claim 12, wherein the selecting of the first insertion candidates comprising:
    determining whether each signal line in the circuit to be designed is a representative fault signal line that considers an equivalent fault; and
    selecting, as the first insertion candidates, one or more signal lines determined to be the representative fault signal line.

14. The computer-implemented method according to claim 10, wherein the circuit net corresponds to a logic cone obtained by back-tracing signal lines from the maximum observation point to an input point into which a value set in the circuit is to be input or to a control point into which a value in the circuit is sattable.

15. The computer-implemented method according to claim 10, the selecting of the second insertion candidate comprising:
    calculating, when the test point is provisionally inserted into each of the first insertion candidates, the plurality of diagnosis difficulty indexes of all the observation points, considering effect of provisionally inserting the test point onto the first insertion candidate;
    calculating dispersion of the plurality of diagnosis difficulty indexes calculated; and
    selecting, as the second candidate, an insertion candidate that causes the calculated dispersion to be the smallest, from the first insertion candidates.

16. The computer-implemented method according to claim 15, wherein the dispersion is a standard deviation of the plurality of diagnosis difficulty indexes of all the observation points calculated when the test point is provisionally inserted.

17. The computer-implemented method according to claim 10, wherein the plurality of diagnosis difficulty indexes is each the number of faults observed at the corresponding observation point.

18. A non-transitory computer-readable recording medium having stored therein a design assist program for causing a computer that selects, as an insertion candidate, a signal line onto which a test point for test controlling is to be inserted and which is included in a circuit to be designed, to carry out a process comprising:
    selecting first insertion candidates being a plurality of signal lines in a circuit net the vertex of which is a maximum observation point having a maximum diagnosis difficulty index among a plurality of diagnosis difficulty indexes of all the observation points that are used for observing signal lines in the circuit, each of the plurality of diagnosis difficulty indexes of the observation points representing the difficulty in fault diagnosis at the corresponding observation point; and
    selecting a second insertion candidate onto which the test point is to be inserted from the first insertion candidates, considering effects of inserting the test point onto the respective first insertion candidates,
    wherein the selecting of the second insertion candidate comprising:
    calculating prospective dispersion of the plurality of diagnosis difficulty indexes of all the observation points, considering an effect of inserting the test point onto each of the first insertion candidates; and
    selecting, as the second insertion candidate, one or more insertion candidates each of which causes the calculated prospective dispersion when the test point is inserted onto the insertion candidate to be smaller than dispersion of the plurality of diagnosis difficulty indexes of all the observation points before the test point is inserted, from the first insertion candidates.

* * * * *